(12) United States Patent
Suhara et al.

(10) Patent No.: US 9,008,526 B2
(45) Date of Patent: Apr. 14, 2015

(54) METHOD OF MEASURING TOTAL AMOUNT OF LATENT IMAGE CHARGE, APPARATUS MEASURING TOTAL AMOUNT OF LATENT IMAGE CHARGE, IMAGE FORMING METHOD AND IMAGE FORMING APPARATUS

(71) Applicants: Hiroyuki Suhara, Kanagawa (JP); Hiroaki Tanaka, Kanagawa (JP)

(72) Inventors: Hiroyuki Suhara, Kanagawa (JP); Hiroaki Tanaka, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 118 days.

(21) Appl. No.: 13/756,741

(22) Filed: Feb. 1, 2013

(65) Prior Publication Data
US 2013/0202321 A1 Aug. 8, 2013

(30) Foreign Application Priority Data

Feb. 2, 2012 (JP) ................................ 2012-021240

(51) Int. Cl.
G03G 15/00 (2006.01)
G01R 29/24 (2006.01)
G03G 15/043 (2006.01)

(52) U.S. Cl.
CPC .............. *G01R 29/24* (2013.01); *G03G 15/043* (2013.01); *G03G 15/5033* (2013.01); *G03G 15/75* (2013.01)

(58) Field of Classification Search
CPC ............................ G03G 15/00; G03G 221/00
USPC .......................................................... 399/48
See application file for complete search history.

(56) References Cited

U.S. PATENT DOCUMENTS

| 5,834,766 | A | 11/1998 | Suhara |
| 6,081,386 | A | 6/2000 | Hayashi et al. |
| 6,376,837 | B1 | 4/2002 | Itabashi et al. |
| 6,400,391 | B1 | 6/2002 | Suhara et al. |
| 6,555,810 | B1 | 4/2003 | Suhara |
| 7,038,200 | B2 * | 5/2006 | Nikolaev ....................... 250/291 |
| 7,612,570 | B2 | 11/2009 | Suhara |
| 8,314,627 | B2 | 11/2012 | Suhara |
| 2001/0048542 | A1 | 12/2001 | Suhara |
| 2002/0080428 | A1 | 6/2002 | Suzuki et al. |
| 2004/0179255 | A1 | 9/2004 | Suhara |

(Continued)

FOREIGN PATENT DOCUMENTS

| JP | 03-049143 | 3/1991 |
| JP | 03-200100 | 9/1991 |

(Continued)

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A method of measuring a total amount of latent image charge includes: scanning a sample with a charged particle beam, the sample having a charge distribution on a surface of the sample, the charge distribution being caused by forming an electrostatic latent image by exposure; measuring a state of a surface charge distribution on the sample based on a detection signal obtained by the scanning; obtaining an electric potential at a potential saddle point, the potential saddle point being formed by the surface charge distribution of the sample; obtaining an electrostatic latent image area, the electrostatic latent image being formed by the surface charge distribution of the sample; and performing a calculation using the electric potential at the potential saddle point and the electrostatic latent image area to measure a total amount of electric charge of the electrostatic latent image.

9 Claims, 27 Drawing Sheets

(56) References Cited

U.S. PATENT DOCUMENTS

| | | |
|---|---|---|
| 2005/0179971 A1 | 8/2005 | Amada et al. |
| 2009/0051982 A1 | 2/2009 | Suhara |
| 2009/0220256 A1 | 9/2009 | Suhara et al. |
| 2009/0302218 A1* | 12/2009 | Suhara .................. 250/310 |
| 2012/0059612 A1 | 3/2012 | Suhara et al. |
| 2012/0321349 A1 | 12/2012 | Suhara |

FOREIGN PATENT DOCUMENTS

| | | |
|---|---|---|
| JP | 2003-295696 | 10/2003 |
| JP | 2003-305881 | 10/2003 |
| JP | 2004-251800 | 9/2004 |
| JP | 2005-166542 | 6/2005 |
| JP | 2008-076099 | 4/2008 |
| JP | 2012-058350 | 3/2012 |

* cited by examiner

CHARGE DISTRIBUTION MODEL

SIMULATION RESULT

RELATIONSHIP BETWEEN ACCELERATING
VOLTAGE AND CHARGE

RELATIONSHIP BETWEEN ACCELERATING VOLTAGE
AND CHARGE POTENTIAL

FIG. 9
(a)
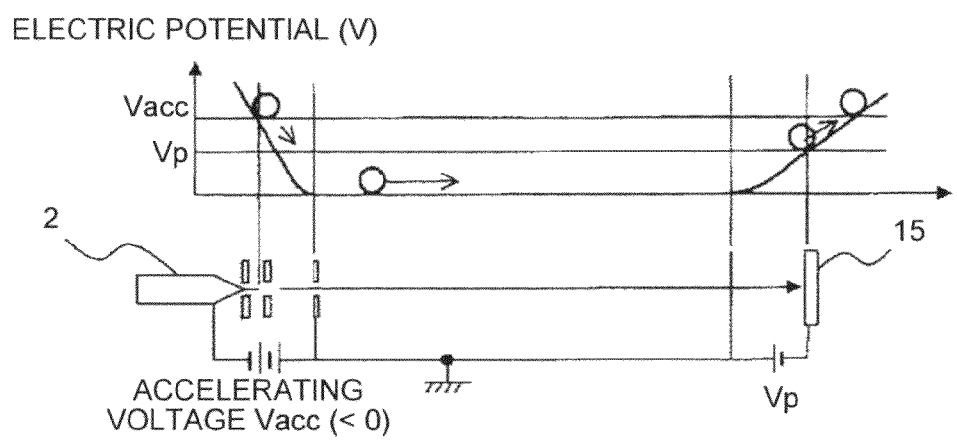
(b)
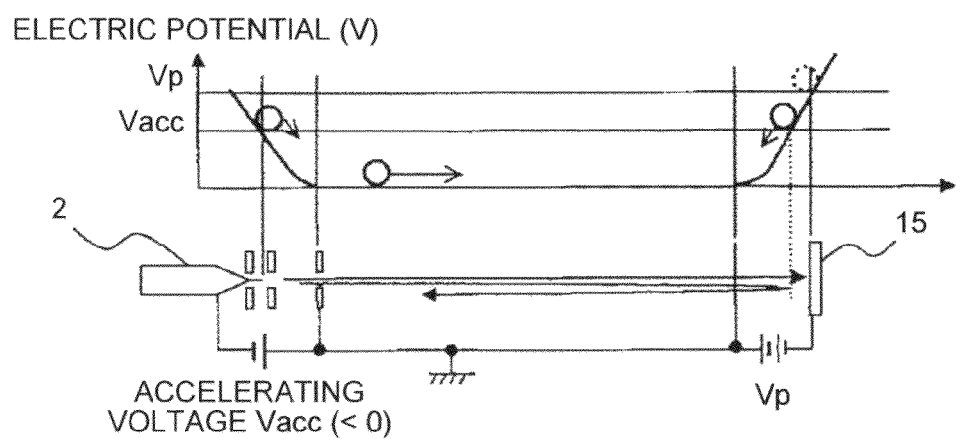

SPACE POTENTIAL CONTOUR LINES

SURFACE POTENTIAL

SPACE POTENTIAL DISTRIBUTION IN HORIZONTAL
DIRECTION OF SAMPLE (CROSS SECTION x)

SPACE POTENTIAL DISTRIBUTION IN DIRECTION
PERPENDICULAR TO SAMPLE (CROSS SECTION z)

POTENTIAL SADDLE POINT MEASUREMENT
BY BACK-FACE VOLTAGE APPLYING UNIT

LATENT IMAGE MEASUREMENT RESULT BY
DETECTING SECONDARY ELECTRON IMAGE

ACTUAL MEASUREMENT RESULT

CHARGING IMAGE IN CASE
OF $|Vacc| < |Vs|$

IMAGE PROCESSING UNIT (IPU)

γ CORRECTION

METHOD OF MEASURING TOTAL AMOUNT OF LATENT IMAGE CHARGE, APPARATUS MEASURING TOTAL AMOUNT OF LATENT IMAGE CHARGE, IMAGE FORMING METHOD AND IMAGE FORMING APPARATUS

CROSS-REFERENCE TO RELATED APPLICATIONS

The present application claims priority to and incorporates by reference the entire contents of Japanese Patent Application No. 2012-021240 filed in Japan on Feb. 2, 2012.

BACKGROUND OF THE INVENTION

1. Field of the Invention

The present invention relates to a method of measuring a total amount of latent image charge, an apparatus measuring a total amount of latent image charge, an image forming method using a result by the measurement method or the measurement apparatus, and an image forming apparatus, such as a copier, a printer, a facsimile, a plotter and an MFP that includes at least one of these, using a result by the measurement method or the measurement apparatus.

2. Description of the Related Art

Controlling a toner attachment amount is important for an electrophotography process. For this purpose, an amount of latent image charge that disappears by exposure is preferred to be appropriately controlled. However, fatigue of a photosensitive element in association with environmental change and continuous operation changes a total amount of latent image charge even if exposure energy and a charge potential is not changed. In view of this, it is preferred to precisely acquire a total amount of latent image charge of an electrostatic latent image, which is formed under a process condition, characteristics of the photosensitive element, and an exposure condition.

In a parallel plate capacitor model, in the case where a potential difference V is applied across electrode plates of a capacitor with electric capacitance C, an electric charge Q stored in the capacitor is proportionate to V and the following relation is satisfied:

$$Q=CV$$

Under this condition, the amount of electric charge is proportionate to the electric potential. Accordingly, simply obtaining the electric potential allows easily measuring the charge amount. Because a target latent image charge of the present invention is a small charge such as from several micron to hundreds micron, the relation of Q=CV in the parallel plate capacitor model is not satisfied. In view of this, conventional method has not allowed accurately measuring the amount.

As a method of observing an electrostatic latent image using an electron beam, a method disclosed in Japanese Patent Application Laid-open No. H3-049143 has been known. However, the sample is limited to an LSI chip and a sample that can store and hold the electrostatic latent image. That is, measurement is impossible in a general photosensitive element where dark decay occurs. A general dielectric semipermanently holds an electric charge. Thus, an amount of electric charge can be measured using a large amount of time after a charge distribution is formed without any influence on a measurement result. However, since the photosensitive element does not have an infinite resistance, it cannot hold the electric charge for a long period of time, causing dark decay and thus decreasing a surface potential with time. The photosensitive element can hold the electric charge for several tens of seconds at most even in a darkroom. Therefore, when attempting to observe the electrostatic latent image through a scanning electron microscope (SEM) after charging and exposing, the electrostatic latent image will disappear during the preparation stage.

In view of the above-described circumstances, the applicant has proposed a method that allows measuring an electrostatic latent image even using a photoreceptor sample with dark decay (see Japanese Patent Application Laid-open No. 2003-295696 and Japanese Patent Application Laid-open No. 2004-251800). A charge distribution on a sample surface forms an electric field distribution in a space corresponding to the surface charge distribution. In view of this, in the case where the sample surface is scanned with a charged particle beam, a secondary electron generated by that an incident electron reaches the sample is pulled back by this electric field. This reduces the amount of the secondary electrons that reach the detector. Therefore, this provides a contrast where a portion with an intense electric field becomes dark and a portion with a weak electric field becomes bright, thus allowing detection of a contrast image corresponding to the surface charge distribution. Accordingly, when exposure is performed, an exposed portion appears black and a non-exposed portion appears white. Thus, the formed electrostatic latent image can be measured. Additionally, this applicant has proposed a method where measurement is performed under a condition that there is a region where a velocity vector of an incident charged particle perpendicular to a sample is reversed (see Japanese Patent Application Laid-open No. 2005-166542). Use of this method allows visualizing a latent image profile in the order of micron, which was conventionally difficult.

As described above, accurately measuring the total amount of the latent image charge that disappears by exposure allows controlling the toner attachment amount with high accuracy, thus contributing to high image quality. However, the method disclosed in Japanese Patent Application Laid-open No. 2005-166542 can visualize the electrostatic latent image, but cannot accurately measure the total amount of the latent image charge.

In view of the above-described circumstances, there is a need to provide a method of measuring a total amount of latent image charge that allows accurately measuring a total amount of latent image charge and contributing high image quality by reflecting a result of the measurement on the control of the toner attachment amount.

SUMMARY OF THE INVENTION

It is an object of the present invention to at least partially solve the problems in the conventional technology.

A method of measuring a total amount of latent image charge, includes: scanning a sample with a charged particle beam, the sample having a charge distribution on a surface of the sample, the charge distribution being caused by forming an electrostatic latent image by exposure; measuring a state of a surface charge distribution on the sample based on a detection signal obtained by the scanning; obtaining an electric potential at a potential saddle point, the potential saddle point being formed by the surface charge distribution of the sample; obtaining an electrostatic latent image area, the electrostatic latent image being formed by the surface charge distribution of the sample; and performing a calculation using the electric potential at the potential saddle point and the electrostatic latent image area to measure a total amount of electric charge of the electrostatic latent image.

An apparatus measuring a total amount of latent image charge, includes: a charging unit that charges a sample; an exposing unit that forms an electrostatic latent image on the charged sample; a charged particle beam scanning unit that two-dimensionally scans a sample surface with a charged particle beam, the sample surface having a charge distribution caused by formation of the electrostatic latent image; a unit that obtains an electric potential at a potential saddle point formed by a surface charge distribution of the sample; a unit that obtains an area of an electrostatic latent image formed by a surface charge distribution of the sample; and a unit that calculates a total amount of latent image charge based on the obtained electric potential at the potential saddle point and the obtained electrostatic latent image area.

The surface charge described here is, strictly speaking, spatially dispersed in the sample, as is well-known. In view of this, the surface charge refers to being in the state where a charge distribution where charge is more largely distributed in an in-plane direction than in a thickness direction. The electric charge includes not only electrons but also ions. Additionally, The surface charge may also refer to being in the state where the surface may have a conductive portion and a voltage is applied to the conductive portion, and thereby an electrical potential distribution is generated on the sample surface or the proximity of the sample surface.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 9 is a diagram illustrating a relationship between an incident electron and a sample in a signal detection;

DETAILED DESCRIPTION OF THE PREFERRED EMBODIMENTS

A description will be given of an embodiment of the present invention below by referring to the accompanying drawings. First, a method of measuring a total amount of latent image charge will be described based on FIG. 1. Here, the total amount of the latent image charge means the amount obtained by subtracting an actual amount of electrification charge from a total amount of charge when electrification charge is uniform. Specifically, the total amount of the latent image charge is defined as the amount of electric charge that disappears by exposure.

Figure 1:
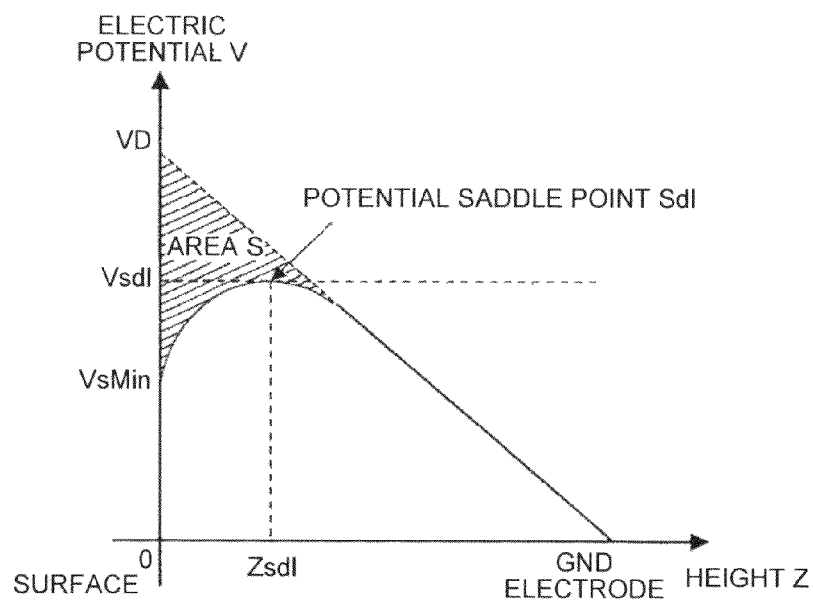
FIG. 1 is a graph illustrating a space potential distribution in a direction perpendicular to a sample as a basis for obtaining a total amount of latent image charge in a method of measuring the total amount of the latent image charge according to one embodiment of the present invention.

FIG. 1 is a conceptua graph illustrating a space potential distribution in a direction perpendicular to a sample with a charge distribution. When electric charge is uniform at an electric potential VD, a linear electric potential is formed from a surface to an upper electrode. A space potential $\phi$ (RO) when an electric charge density is $\sigma$ (R) is expressed by an expression (1).

$$\phi(R_0) = \frac{1}{4\pi\varepsilon_0} \int\int \frac{\sigma(R)}{|R-R_0|} ds \quad (1)$$

It may be regarded that the electric potential on the axis reduces by an amount of the latent image charge that disappears by exposure. That is, an area S in FIG. 1 represents an electric potential reduction corresponding to the expression (1) caused by the latent image charge. The inventors focused on a fact that this electric potential reduction can be regarded as a component equivalent to the amount of the latent image charge, and obtained knowledge that measuring the area S allows measuring the total amount of the latent image charge. It is difficult to theoretically derive the area S in a direct way. However, as a result of investigation, the inventors found that the total amount of the latent image charge ΣQi most strongly has a correlation as an expression (2).

$$\sum Q_i = K \cdot \frac{VthD^2}{VD} \cdot \frac{\langle LtR \rangle}{\log\langle LtR \rangle} \quad (2)$$

VthD denotes a difference between the charge potential VD and an electric potential Vsdl at a potential saddle point. <LtR> denotes an average circle-equivalent diameter (a radius) of a latent image area LtS. An expression (3) and an expression (4) to obtain these will be shown as follows. Here, K is a constant based on a characteristic of a photosensitive element, and allows calibration.

$$VthD = VD - V_{sdl} \quad (3)$$

$$\langle LtR \rangle = \sqrt{\frac{LtS}{\pi}} \quad (4)$$

Deriving a latent image depth VthD from a difference operation between the potential saddle point Vsdl and the charge potential VD (the expression (3)), deriving the average circle-equivalent diameter <LtR> from a square-root operation of the latent image area LtS (the expression (4)), and performing an operation such as multiplication on the latent image depth VthD and the average latent image diameter <LtR> allow measuring the total amount of the latent image charge. Therefore, measuring the potential saddle point Vsdl and the latent image area LtS allows measuring the total amount of the latent image charge.

Figure 2:
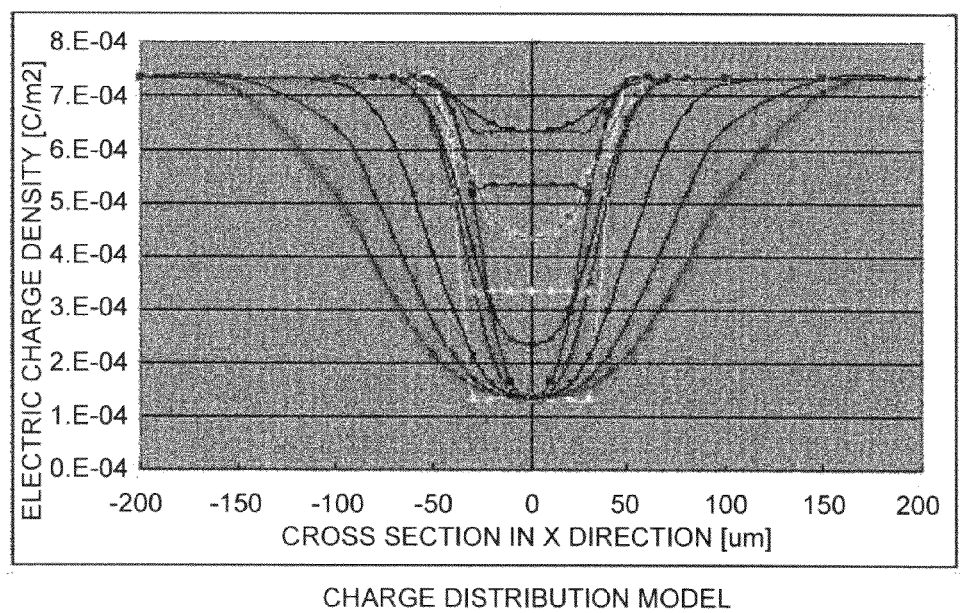
FIG. 2 is a graph illustrating a charge distribution model in a simulation.
Figure 3:
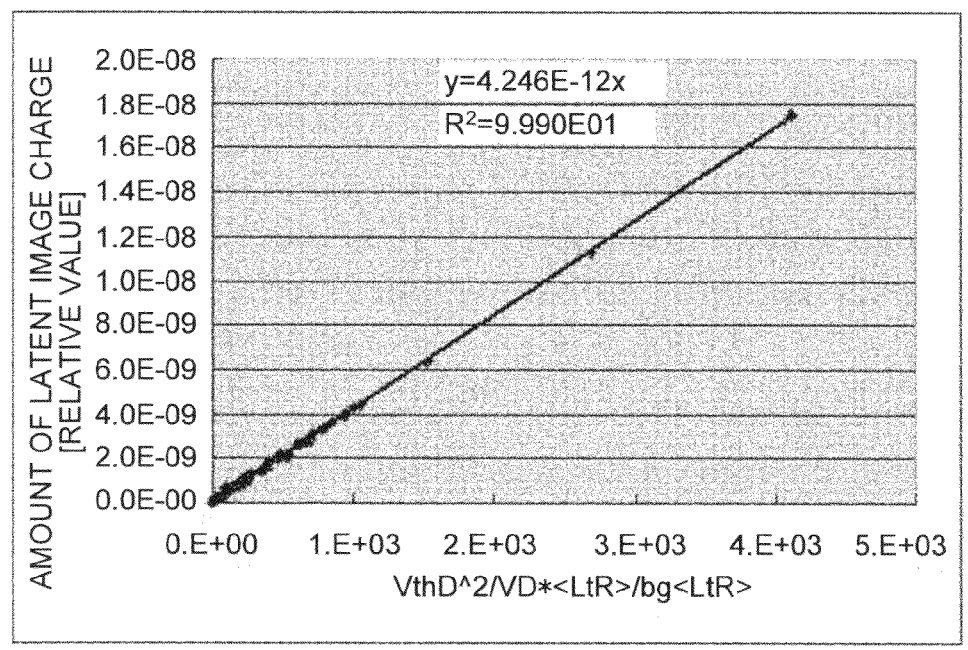
FIG. 3 is a graph illustrating a result of the simulation.

FIG. 2 and FIG. 3 illustrate simulation results. FIG. 2 illustrates a latent image charge model for which calculation was performed using an expression (5) for equal to or more than 50 samples with different sizes, shapes, and depths. In FIG. 2, a unit of the electric charge density of "m2" indicates "m$^{-2}$" while a unit of a cross section of "um" indicates "μm". Parameters of the simulation were as follows.

Qmax=−0.000535 to −0.000935 C/m$^2$

QD=−0.001 to −0.006 C/m$^2$

σx=10 to 100 μm

σy=σx, √2σx

α=1.4, 20

β=1

Here, the simulation was performed using the sample with relative permittivity of three and a film thickness of 30 μm.

$$Q(x, y) = Q_{max} - QD \times \exp\left[-\left\{\left(\frac{x^2}{\sigma_x^2}\right)^\beta + \left(\frac{y^2}{\sigma_y^2}\right)^\beta\right\}^\alpha\right] \quad (5)$$

The horizontal axis in FIG. 3 denotes the average latent image diameter <LtR> while the vertical axis denotes a relative value of the total amount of charge distribution directly calculated from a charge distribution model. From the simulation result, it can be seen that a correlation coefficient R$^2$ equals to 0.999 and thus a proportional relation is approximately satisfied. In FIGS. 2 and 3, for example, 1.E-04 indicates 1×10$^{-4}$. Other signs are similar to this. Additionally, "VthD^2" in FIG. 3 indicates "VthD$^2$".

Figure 4:
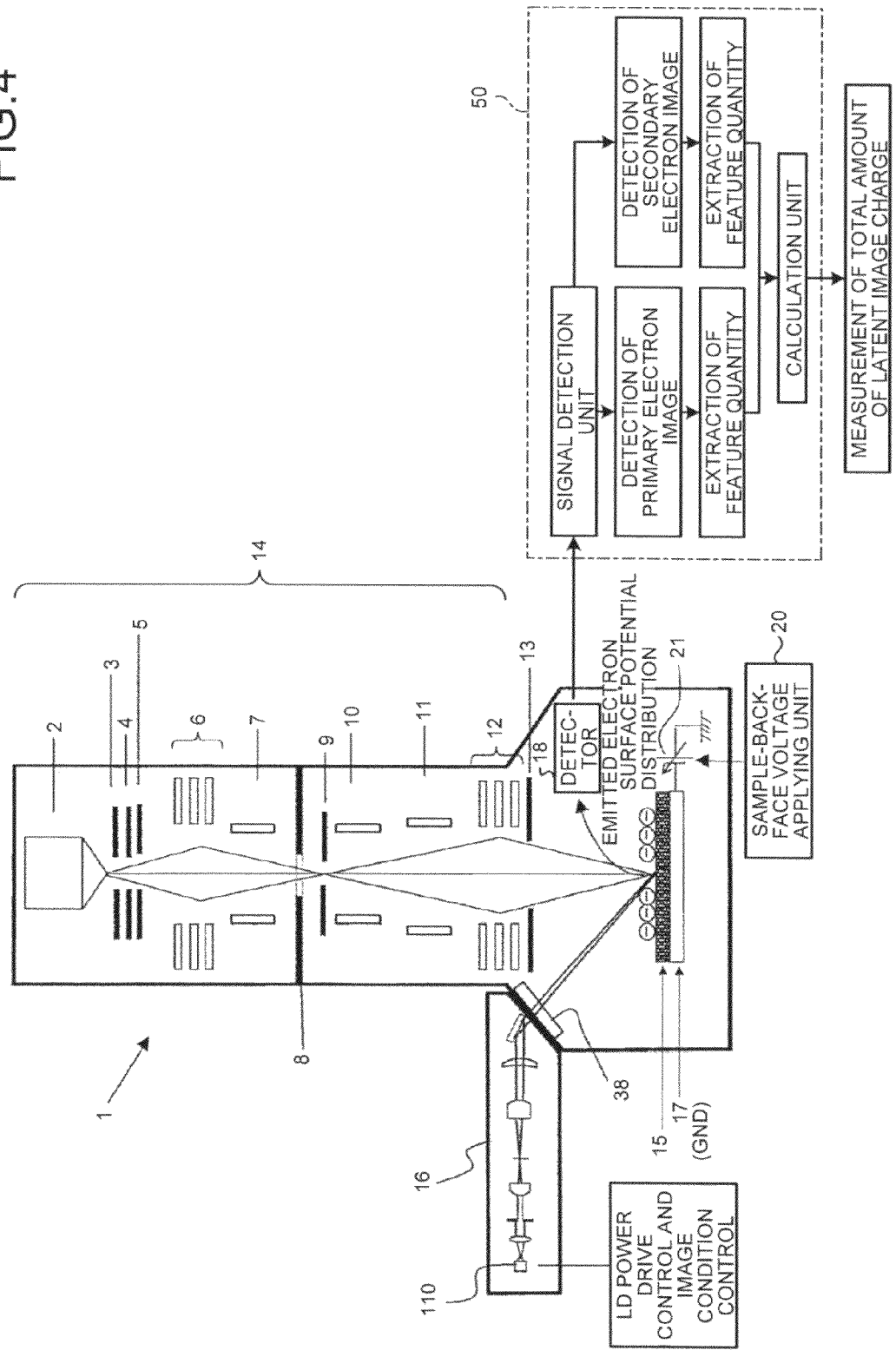
FIG. 4 is a schematic block diagram illustrating an apparatus measuring a total amount of latent image charge.

Next, based on FIG. 4, a description will be given of an apparatus measuring the total amount of the latent image charge with a unit that scans the sample that has a surface charge distribution, with a charged particle beam to detect a signal.

An apparatus measuring total amount of latent image charge 1 includes a charged particle irradiating unit (a charged particle optical system) 14, which irradiates a charged particle beam, an optical writing scanning unit 16 as an exposing unit, a sample setting unit 17 as a conductor, a detector 18 as a unit to detect a primary reversed charged particle (the primary electron), a secondary electron, and so on. The optical writing scanning unit 16 includes a laser diode (LD) 110 as a light source. A light beam finally passes through an entrance window 38, and forms an electrostatic latent image on a surface of a photoreceptor sample (hereinafter also referred to simply as a "sample") 15 charged uniformly. A power of the LD 110 is drivingly controlled according to an image forming condition by a control unit described later. Here, the charged particle indicates a particle such as an electron beam or an ion beam that is affected by an electric field or a magnetic field. Hereinafter, an embodiment in which an electron beam is irradiated will be described.

The electron beam irradiation unit 14 includes an electron gun 2, a suppressor electrode 3, an extraction electrode 4, an accelerating voltage 5, a condenser lens 6, a beam blanker 7, a gate valve 8, a stigmator 10, a deflection electrode (scanning lens) 11, an electrostatic objective lens 12, and a beam emission opening 13. The electron gun 2 serves to generate an electron beam. The suppressor electrode 3 serves to control the electron beam. The accelerating voltage 5 controls energy of the electron beam. The condenser lens 6 serves to converge the electron beam generated from the electron gun. The beam blanker 7 serves to turn on and off the electron beam. The stigmator 10 serves to correct astigmatism of the electron beam that has passed through the beam blanker 7. The scanning lens 11 serves to perform scanning with the electron beam that has passed through the stigmator 10. The electrostatic objective lens 12 serves to focuse the electron beam that has passed through scanning lens 11 again. The respective lenses and similar member are coupled to a power supply to drive (not shown). Note that in the case of the ion beam, a liquid metal ion gun is used instead of the electron gun for example. As the detector 18 as a unit to detect an electron, a scintillator detector, a photomultiplier tube, or the like is employed. The sample setting unit 17 can be displaced in the xy direction in a horizontal surface by a displacement unit (not shown), making it possible to pefrom two-dimensional scanning by the electron beam irradiation unit 14.

Figure 5:
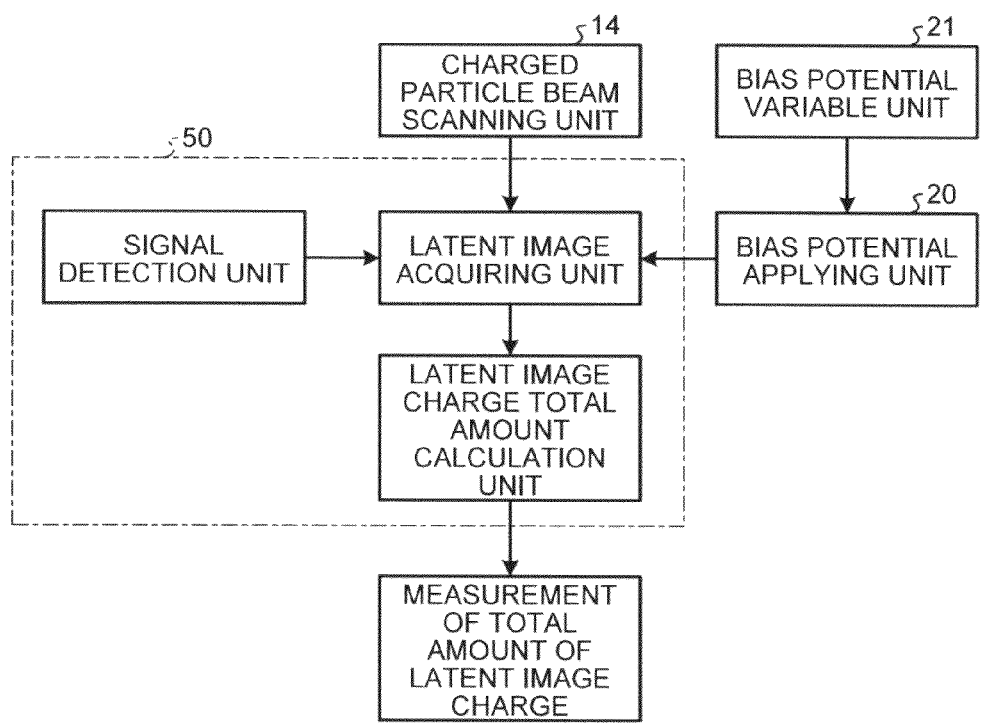
FIG. 5 is a control block diagram.
Figure 6:
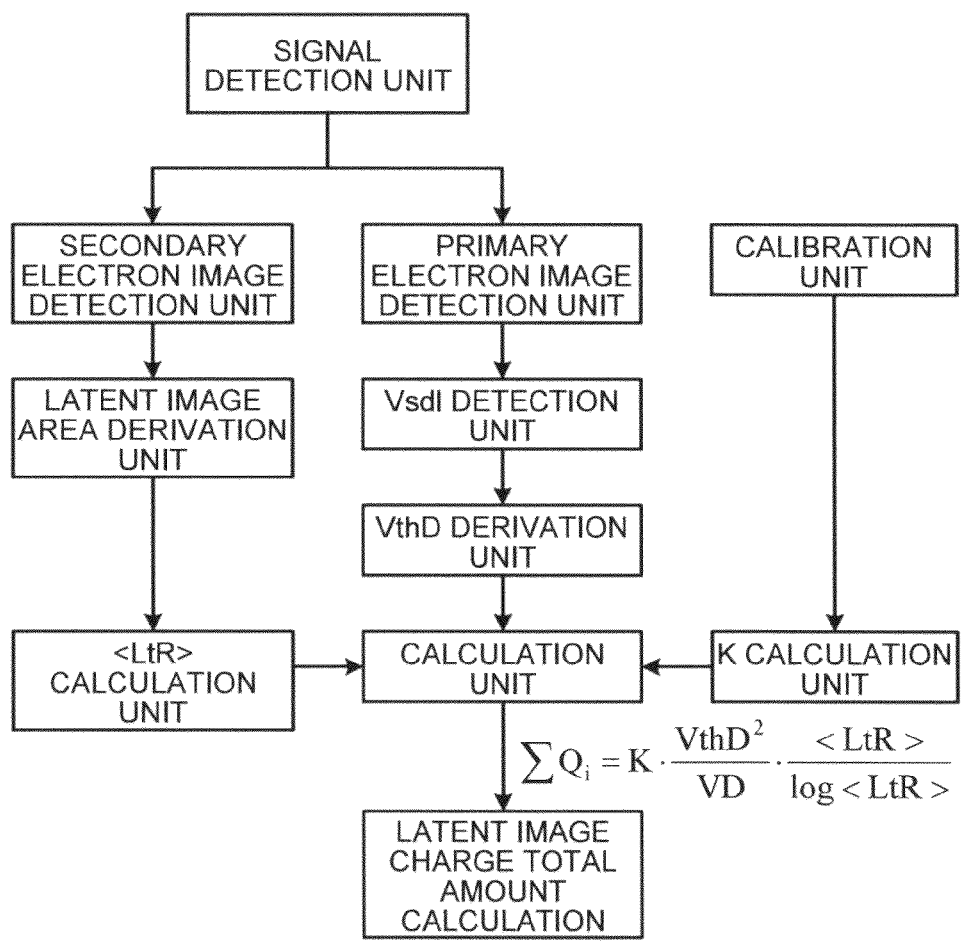
FIG. 6 is a block diagram illustrating a detail of the control block diagram of FIG. 5.

An output signal from the detector 18 is converted into an image signal. A voltage is applied to the sample setting unit 17 by a sample-back-face voltage applying unit 20. At this time, based on the back-side applied voltage and image information, it is determined whether a primary electron image or a secondary electron image, and feature quantities such as a potential saddle point and a latent image area are extracted from the respective images. The total amount of the latent image charge is calculated by, for example, a calculation unit that performs numerical analysis such as multiplication of these measured physical quantities. FIGS. 5 and 6 illustrate detailed block diagrams. As illustrated in FIG. 4, the output signal from the detector 18 is input to a signal detection unit that constitutes a control unit 50. A latent image acquiring unit in FIG. 5 detects the primary electron image, the secondary electron image, and feature quantities of these images illustrated in FIG. 4. A latent image charge total amount calculation unit illustrated in FIG. 5 corresponds to the calculation unit illustrated in FIG. 4. FIG. 6 indicates a function of the latent image acquiring unit in detail. The control unit 50 also serves to control an LD power of the optical writing scanning unit 16.

Figure 7:
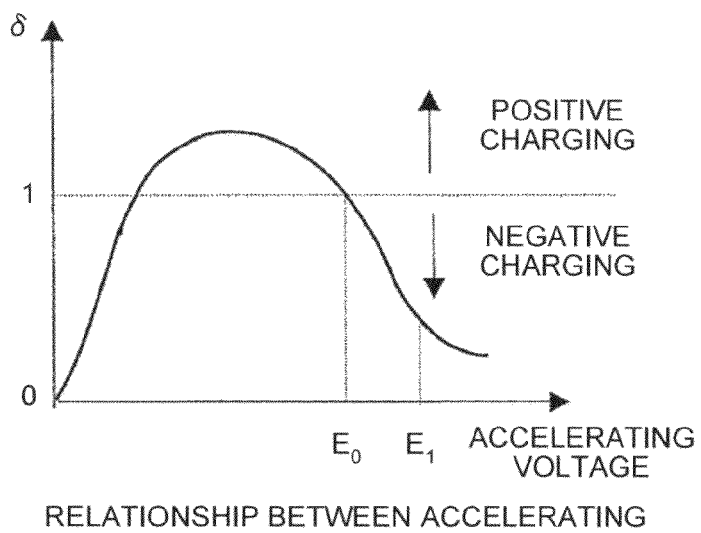
FIG. 7 is a characteristic diagram illustrating a relationship between an accelerating voltage and a charge.

Next, a description will be given of a charging unit that charges the surface of the photoreceptor sample 15. In an actual apparatus, a photosensitive element for electrophotography is necessary to be charged with an electric potential with an absolute value of about 400 to 1000 V. Accordingly, since the charged particle beam is usable in a vacuum environment, the photosensitive element is necessary to be charged with a desired electric potential in a vacuum chamber. First, the electron beam irradiation unit 14 irradiates the photoreceptor sample 15 with the electron beam. As illustrated in FIG. 7, an accelerating voltage E1 is set to an accelerating voltage higher than an accelerating voltage E0 where a secondary-emission coefficient δ is one. Thus, an incident electron amount exceeds an emitted electron amount. This accumulates electrons on the sample and causes charge-up. As a result, the sample can be uniformly charged with negative electricity. A proper accelerating voltage and a proper irradiation time allow providing a desired charge potential.

Figure 8:
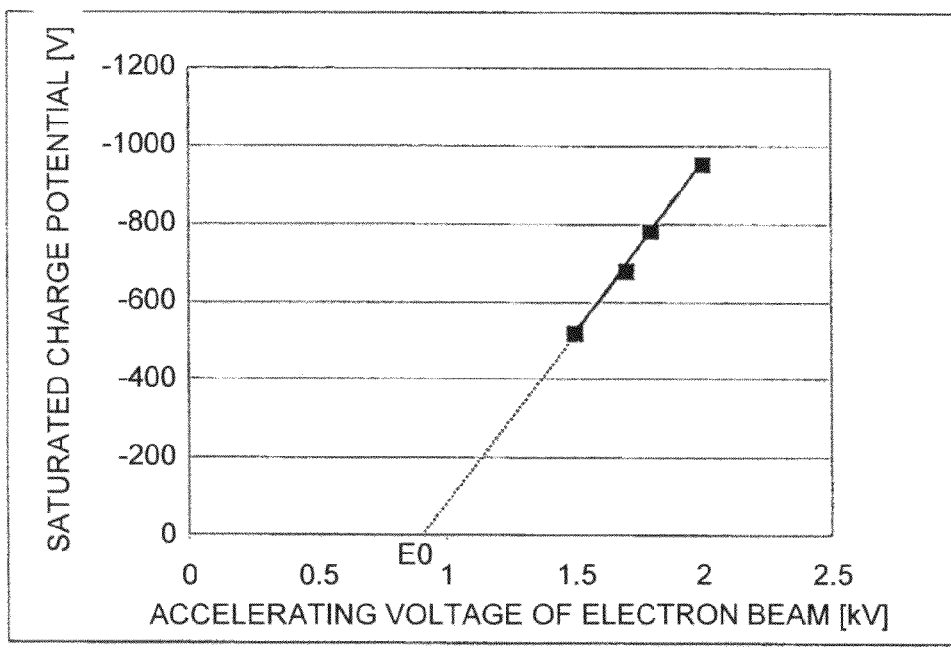
FIG. 8 is a characteristic diagram illustrating a relationship between an accelerating voltage and a charge potential.

There is a relationship between the accelerating voltage and the charge potential as illustrated in FIG. 8. A proper accelerating voltage and a proper irradiation time allows providing the same charge potential as that provided by the actual apparatus in electrophotography. Specifically, irradiating the sample using an accelerating voltage E1 of electrons satisfying the following condition allows charging the sample to an electric potential Vs.

$$|E1-E0| \geq |Vs|$$

This irradiation of a probe current of several nA is employed since a larger probe current achieves a target charge potential in a short time.

As another charging method, a voltage may be applied to a back-side electrode. In order to charge the sample to the electric potential Vs, a charging method may be employed that irradiates the sample with electrons under the condition where the following expression is satisfied when assuming that the back-side electrode voltage is Vsub in a range where a relationship between the accelerating voltage of the electrons irradiated for a certain period of time and a saturated charge potential of the sample can be approximated by a straight line.

$$|E_1 - E_0 + V\text{sub}| \geq |Vs|$$

Next, a primary electron detection unit will be described. FIG. 9 illustrates a relationship between the incident electron and the sample in signal detection. There is a region in which a state where a velocity vector of an incident charged particle in the direction perpendicular to the sample is reversed before the incident charged particle reaches the sample appears and the primary incident charged particle is detected in this configuration. The acceleration voltage is usually expressed in positive values while the applied voltage Vacc of the accelerating voltage is a negative value. In order to provide a physical meaning as an electric potential, expressing polarity makes the description easier. Thus, the accelerating voltage is expressed in negative values (Vacc <0) here. An acceleration electric potential of the electron beam is assumed to be Vacc (<0) while a space electric potential is assumed to be Vp (<0). An electric potential is an electrical potential energy that a unit charge has. Accordingly, the incident electron moves at a velocity corresponding to the accelerating voltage Vacc at a potential of zero (V). As the incident electron approaches a surface of the sample, the electric potential becomes higher and the velocity changes by influence of Coulomb repulsion of the electric charge of the sample.

Accordingly, the following phenomenon generally occurs. In the case where |Vacc|>|Vp|, although the velocity of the electron is decreased, the electron reaches the sample (FIG. 9(*a*)). In the case where |Vacc|<|Vp|, the velocity of the incident electron is gradually decreased due to influence of the electric potential of the sample, the velocity becomes zero before the incident electron reaches the sample, and then the incident electron moves in the opposite direction (FIG. 9(*b*)). In a vacuum state without air resistance, the conservation law of energy is almost completely satisfied. Therefore, the surface potential can be measured by measuring the energy at the sample surface when the energy of the incident electron is varied, that is, measuring a condition where the landing energy becomes approximately zero. Here, a primary reversed charged particle is referred to as a primary reversed electron especially in the case of an electron. The secondary electron, which is generated when reaching the sample, and the primary reversed charged particle are significantly different in amount of particles that reaches the detector. Thus, the secondary electron and the primary reversed charged particle are distinguishable by a boundary of brightness contrast.

A scanning electron microscope or the like includes a reflection electron detector. In this case, a reflection electron generally refers to an electron that is caused to escape from the sample surface due to that an incident electron is reflected (scattered) to the rear back face of the sample by the interaction with a substance of the sample. The energy of the reflection electron is comparable to that of the incident electron. The intensity of the reflection electron increases as the atomic number of the sample increases. Therefore, this is used as a method of detecting a difference of components of the sample and unevenness of the sample surface. In contrast, the primary reversed electron is an electron that is reversed before reaching the sample surface, due to the influence of the electrical potential distribution of the sample surface. Therefore, this is quite a different phenomenon from that of the reflection electron. Thus, the sample surface is scanned with the electron while the accelerating voltage Vacc or electrode potential Vsub on the back face of the sample is varied, so as to detect the incident electron. This configuration allows measuring the surface potential Vp of the sample. In the case where the potential Vp of the sample satisfies Vp>0, a positive ion such as gallium or a proton may be simply irradiated.

Therefore, assuming that the electrical potential distribution of the sample is Vp(x), when performing scanning of the sample with the charged particle with the accelerating voltage Vacc in a range of Min|Vp|≤|Vacc|≤Max|Vp|, a state where the velocity vector of the incident charged particle in the direction perpendicular to the sample is reversed appears.

Detecting the reversed primary reversed charged particle allows obtaining information of the charge distribution on the sample surface.

Figure 10:
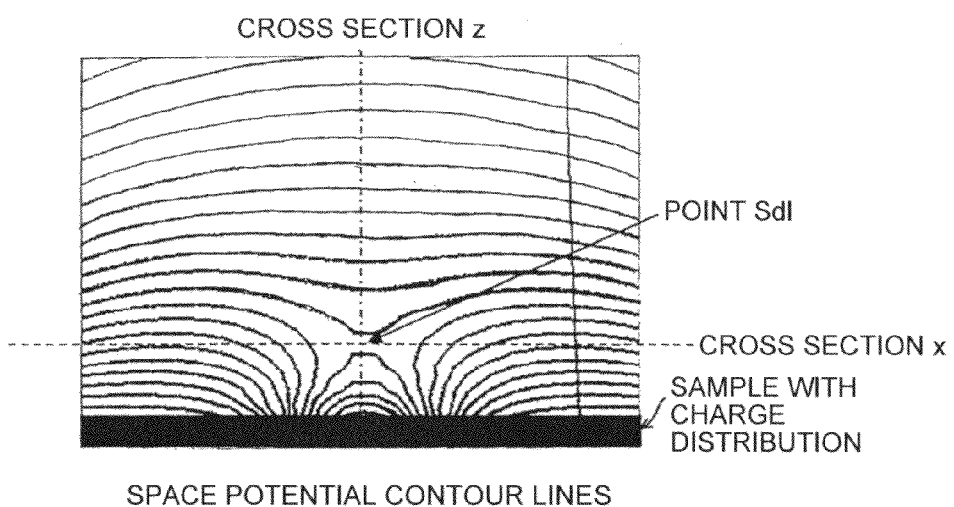
FIG. 10 is a graph illustrating contour lines of a space potential formed above the sample.
Figure 11:
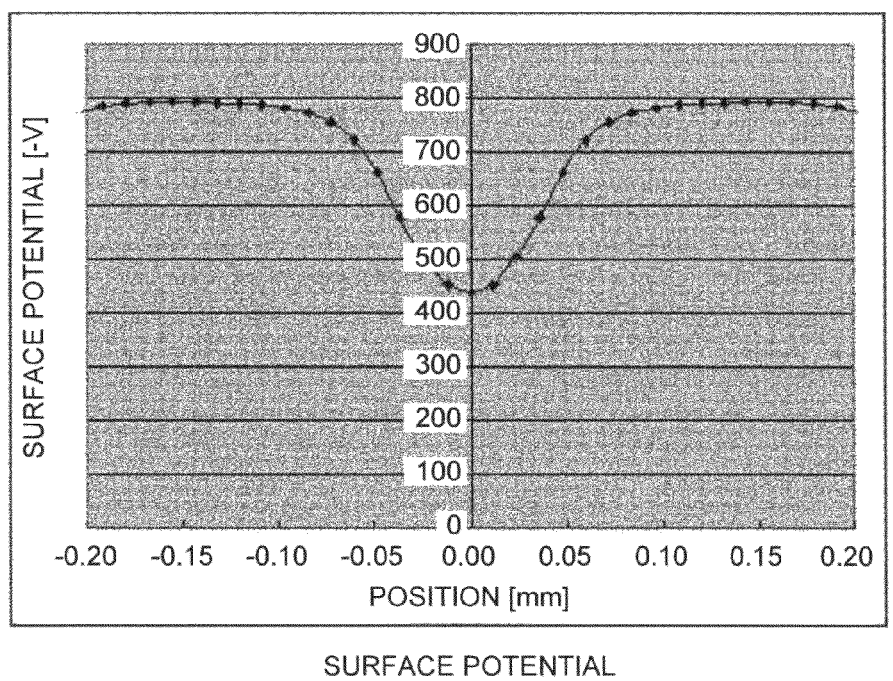
FIG. 11 is a graph illustrating a surface potential of the sample.
Figure 12:
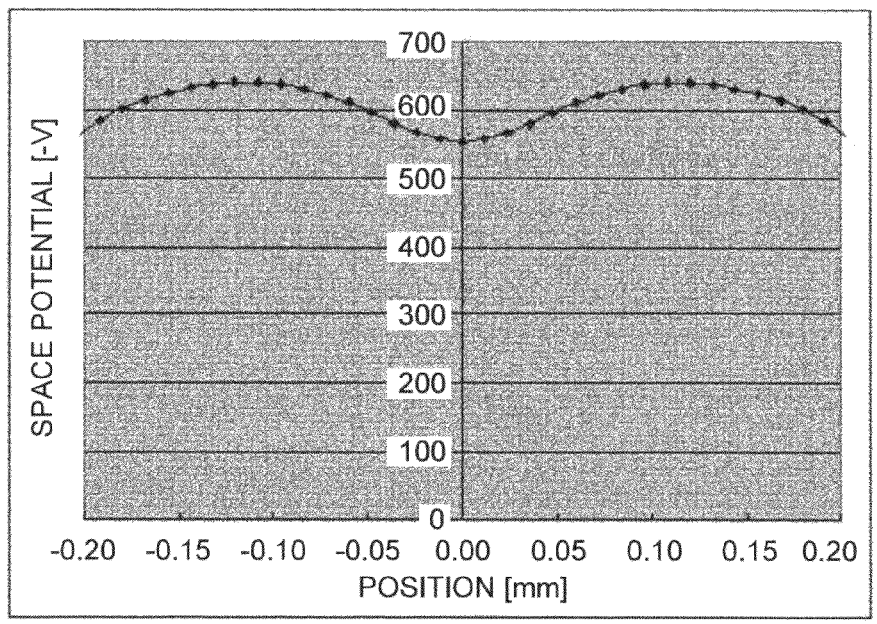
FIG. 12 is a graph illustrating the space potential distribution in a horizontal direction of the sample.
Figure 13:
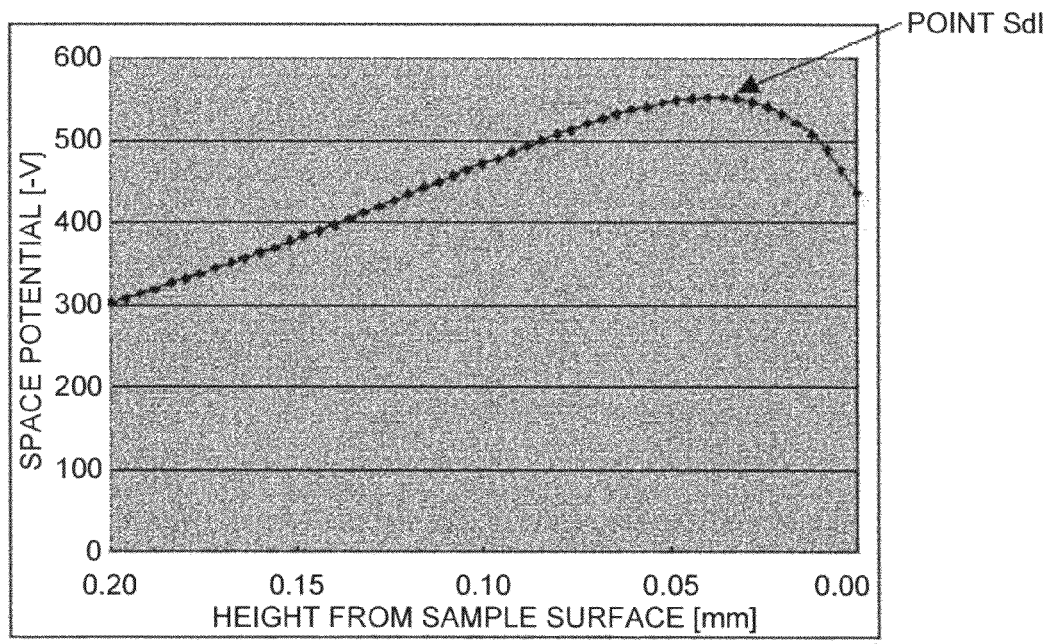
FIG. 13 is a graph illustrating the space potential distribution in the direction perpendicular to the sample.

Next, the potential saddle point will be described. The potential saddle point is an extreme value of a space potential distribution generated from the charge distribution formed in the sample, and is a point of the extreme value in a saddle shape. Specifically, when the space potential is expressed by absolute value, it shows the charge distribution having a minimal value in a direction parallel to the sample surface and has a maximal value in a direction perpendicular to the sample surface. In the case where the sample has a charge distribution that generates an electrical potential distribution illustrated in FIG. 11, the space potential is generated on the sample as illustrated in FIG. 10. As illustrated in FIG. 12, a space potential distribution in the horizontal direction (a cross section x) of the sample takes the minimal value at a point Sdl. As illustrated in FIG. 13, a space potential distribution in the direction (cross section z) perpendicular to the sample takes the maximal value at a point Sdl. Such a position is defined as the potential saddle point.

Figure 14:
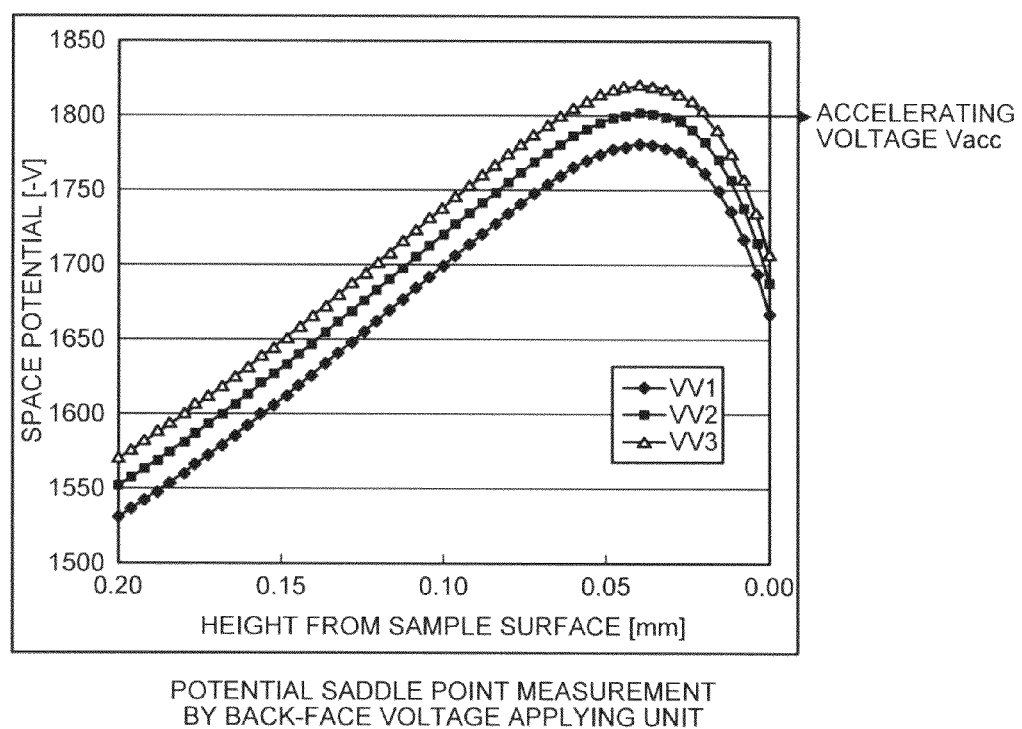
FIG. 14 is a graph illustrating a change in potential saddle point by varying the voltage applied from a back face of the sample.

Next, a method of measuring the potential saddle point will be described. As the method of measuring the potential saddle point, a method that fixes the accelerating voltage Vacc and varies the applied voltage Vsub to the back-side electrode may be employed. Change in accelerating voltage causes change in an incident optical system such as in a focal distance. However, change in voltage applied to the back-side electrode while fixing the accelerating voltage remains the incident optical system fixed as an advantage. Applying a voltage as the applied voltage Vsub to the back-side electrode offsets the space potential. FIG. 14 illustrates a relationship between the potential saddle point and the back-side applied voltage. FIG. 14 illustrates space potential distributions where VV1=−1227 V, VV2=−1247 V, and VV3=−1267 V. In the case where the accelerating voltage Vacc is fixed at −1800 V, the applied voltage is too low to allow the incident charged particle to exceed the potential saddle point under the condition of VV3, and the incident charged particle is reversed and reaches the detector, thus providing a bright image.

Under the condition of VV1, the accelerating voltage is higher than the potential saddle point. Thus, the incident charged particle can exceed the potential saddle point, thus reaching the sample. When the incident charged particle reaches the sample, the secondary electron is generated. However, the energy of the secondary electron is small. This does not allow the secondary electron to escape from the potential saddle point. As a result, the secondary electron cannot reach the detector, thus providing a dark image. Under condition of VV2, this is a boundary point where the detection signal changes from bright to dark and the accelerating voltage can be considered to coincide with the electric potential of the potential saddle point. Accordingly, even in the case where the accelerating voltage is fixed, the electric potential Vsdl of the potential saddle point obtained by measurement can be measured by determining Vsub corresponding to the boundary of whether the incident charged particle can reach the sample or not while changing the back-side applied voltage from VV1 to VV3. In FIG. 14, the boundary of whether the incident charged particle can reach the sample or not is VV2. Thus, Vsdl is measured as follows.

$$Vsdl = Vacc - Vsub2 = -553\ V$$

Next, a secondary electron detection unit will be described. A description will be given of a method that detects the secondary electron and specifies a size of the electrostatic latent image so as to measure the latent image area (LtS). An implementation method that measures a latent image diameter of the charge distribution sample by signal detection is illustrated. This method scans the sample with the charged particle beam to detect emitted secondary electrons with a scintillator detector to convert into an electric signal, thus observing a contrast image. This generates a contrast image with brightness such that a larger amount of the secondary electron is detected in a charged portion and a smaller amount of the secondary electron is detected in an exposed portion. A dark portion can be considered as a latent image portion formed by exposure. The charge distribution on the sample surface provides an electric field distribution corresponding to the surface charge distribution, in a space. In view of this, the secondary electron generated by the incident electron is pushed back by this electric field. This reduces the amount of the secondary electron that reaches the detector. Therefore, according to the charge leakage portion, an exposed portion becomes a black portion and a non-exposed portion becomes a white portion. This allows measuring a contrast image corresponding to the surface charge distribution.

Figure 15A:
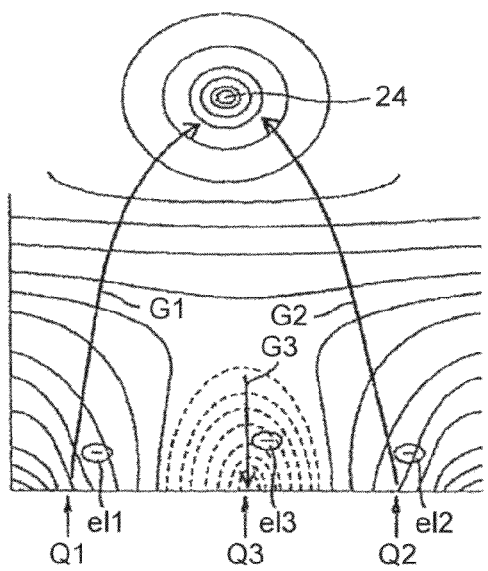
FIGS. 15A and 15B are conceptual diagrams illustrating a method of detecting a secondary electron image.

FIG. 15A is an explanatory diagram illustrating an electrical potential distribution in a space between a charged particle capturing device 24 and the sample SP using contour lines. The surface of the sample SP is uniformly charged in negative polarity except a portion where the electric potential decays by light decay. Since the charged particle capturing device 24 is given a potential of positive polarity, a "potential contour line group illustrated by solid lines" shows that the electric potential is higher as approaching the charged particle capturing device 24 from the surface of the sample SP. Accordingly, secondary electrons e11 and e12 generated at a point Q1 and a point Q2 in the drawing that are "portions uniformly charged with negative polarity" in the sample SP are attracted by a positive electric potential of the charged particle capturing device 24, displaced as illustrated by an arrow G1 and an arrow G2, and captured by the charged particle capturing device 24.

Figure 15B:
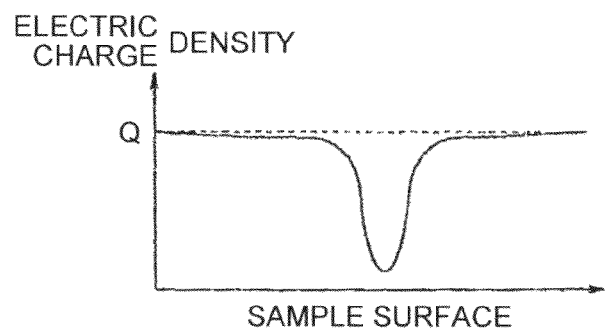

On the other hand, a point Q3 in FIG. 15A is a "portion where a negative electric potential decays by light irradiation". The potential contour lines near the point Q3 are "as illustrated by dashed lines". In this partial electrical potential distribution, "an electric potential is higher in a portion closer to the point Q3". In other words, a secondary electron e13 generated around the point Q3 is affected by an electric force that tends to confine the secondary electron e13 toward the sample SP as illustrated by an arrow G3. Accordingly, the secondary electron e13 is captured by a "potential hole" illustrated by the potential contour line represented by a dashed line, and does not move toward the charged particle capturing device 24. FIG. 15B schematically illustrates the above-described "potential hole". That is, intensity of the secondary electrons (the number of secondary electrons) detected by the charged particle capturing device 24 shows that a portion with high intensity corresponds to a "base portion of the electrostatic latent image (a portion uniformly charged with negative electricity that is represented by the point Q1 and the point Q2 in FIG. 15A)", and a portion with low intensity corresponds to an "image portion of the electrostatic latent image (a portion irradiated with a light that is represented by the point Q3 in FIG. 15A)".

Therefore, by sampling the electric signal obtained by the secondary electron detection unit by a signal processing unit at an appropriate sampling rate, it is possible to specify a surface potential distribution V(X, Y) as described above for each "micro region corresponding to the sampling" using a sampling time T as a parameter. Arranging the above-described surface electrical potential distribution (an electric potential contrast image) V(X, Y) into two-dimensional image data by the signal processing unit and outputting this data by an output device allows obtaining an electrostatic latent image as a visible image. For example, if the intensity of the captured secondary electron is "expressed by intensity of the brightness", contrast is provided such that the image portion of the electrostatic latent image becomes dark and the base portion becomes bright. This allows expressing (outputting) the electrostatic latent image as a contrast image corresponding to the surface charge distribution.

Figure 16:
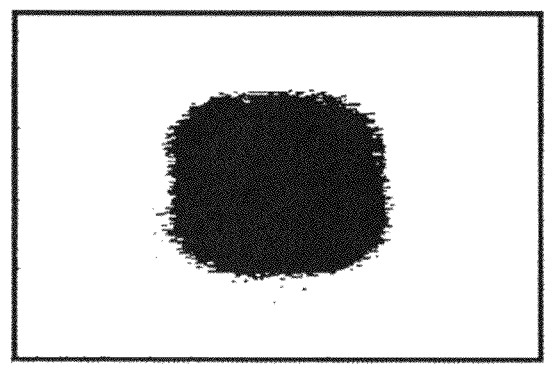
FIG. 16 is a visible image illustrating a measurement result of a latent image by detecting the secondary electron image.

FIG. 16 illustrates an exemplary measurement result. Experimental conditions are as follows.

Experimental Conditions charge potential: −500 V
writing density: 600 dpi
pattern: two-dot isolation
duty ratio: 100%
light source: wavelength of 655 nm
beam spot diameter: main 45×sub 50 μm
exposure energy density: 3 mJ/m$^2$ the secondary electron image is processed by binarization or the like to calculate a dark region, thus obtaining the latent image area LtS. Calculating LtS with the expression (4) allows measuring the latent-image-circle equivalent radius LtR. This allows determining the size of the electrostatic latent image using the secondary-electron signal intensity, thus measuring the latent image area and the latent image diameter with high accuracy.

Figure 17:
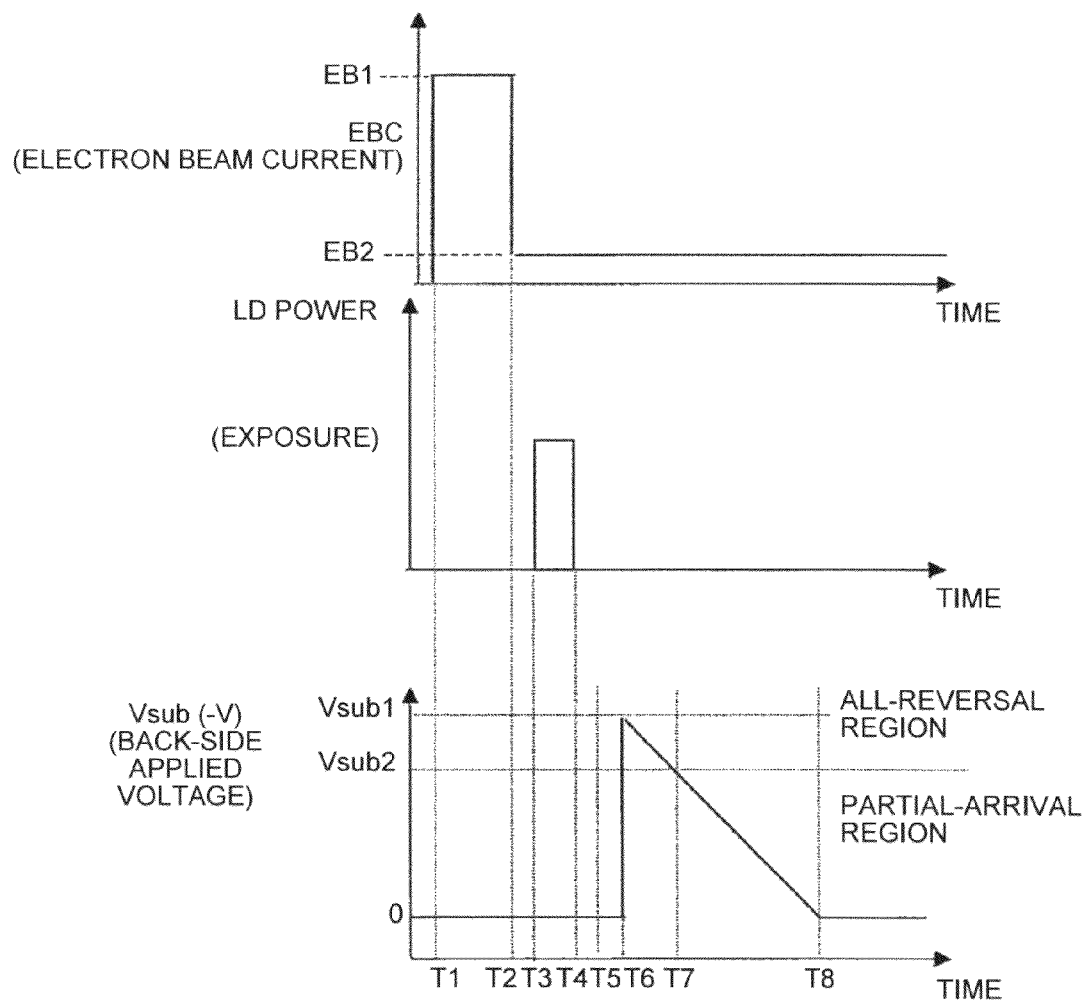
FIG. 17 is a timing chart illustrating a control to obtain the potential saddle point and a latent image area.

Next, a description will be given of a beam current, an exposure timing, and a sequence of a sample applied voltage to obtain the potential saddle point and the latent image area. FIG. 17 illustrates an embodiment in which a unit that sets a voltage applied to the sample back face in synchronization with times of an exposure timing and a signal detection timing, and the electric potential of the potential saddle point and the electrostatic latent image area can be obtained in a sequence of operations. First, as described above, the sample is preliminarily set to a desired charge potential VD.

Time T1: The sample is charged by a beam current EB1. At this time, Vsub=0.

Time T2: The beam current is decreased to EB2 to establish an observation condition.

Time T3: Exposure is started.

Time T4: The exposure is terminated and an electrostatic latent image is formed.

Time T5: An image is obtained to obtain the latent image area under a condition of T4<T5<T6.

At this time, the back-side applied voltage Vsub=0 and all regions satisfy |Vacc|≥|Vp|. Accordingly, the incident electron reaches the sample and generates the secondary electron. By detecting the secondary electron signal, the electrostatic latent image is measured and the latent image area is obtained.

Time T6: The applied voltage Vsub is set to satisfy a condition that the incident electron is reversed in all regions, that is, set to Vsub1 satisfying |Vacc|≤|Vp|.

Time T6 to T8: An image is detected while varying Vsub. Basically, the potential absolute value of Vsub is decreased.

Time T8: The experiment is terminated.

Time T7: As the value of Vsub decreases, the |Vp| decreases and a region satisfying |Vacc|≥|Vp| is partially generated. This allows obtaining the electric potential Vsub2 satisfying |Vacc|=|Vp|. The electric potential Vsub2 may be sequentially obtained or may be obtained in analysis after the experiment is terminated. Calculating a difference between Vsub2 and the accelerating voltage Vacc (<0) as follows allows obtaining Vsdl.

$Vsdl = Vacc - Vsub2$

Vsub may be increased from a lower voltage conversely to the embodiment. However, in this case, the latent image is easily affected by the incident electron reaching the sample. In the case where the voltage is decreased from the high level condition as in the embodiment, the measurement starts with a condition where the incident electron does not reach the sample. This reduces influence on the latent image and thus this case can be considered as effective. The above measurement allows measuring the total amount of the latent image charge.

Figure 18:
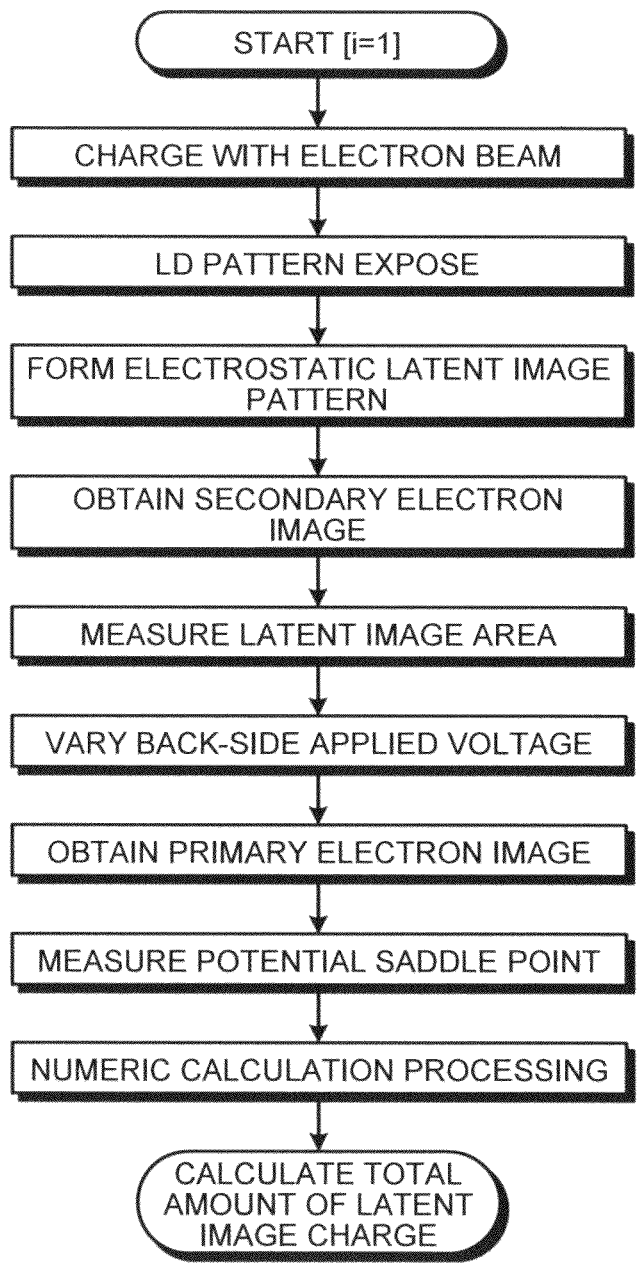
FIG. 18 is a flowchart of a control to calculate the total amount of the latent image charge.
Figure 19:
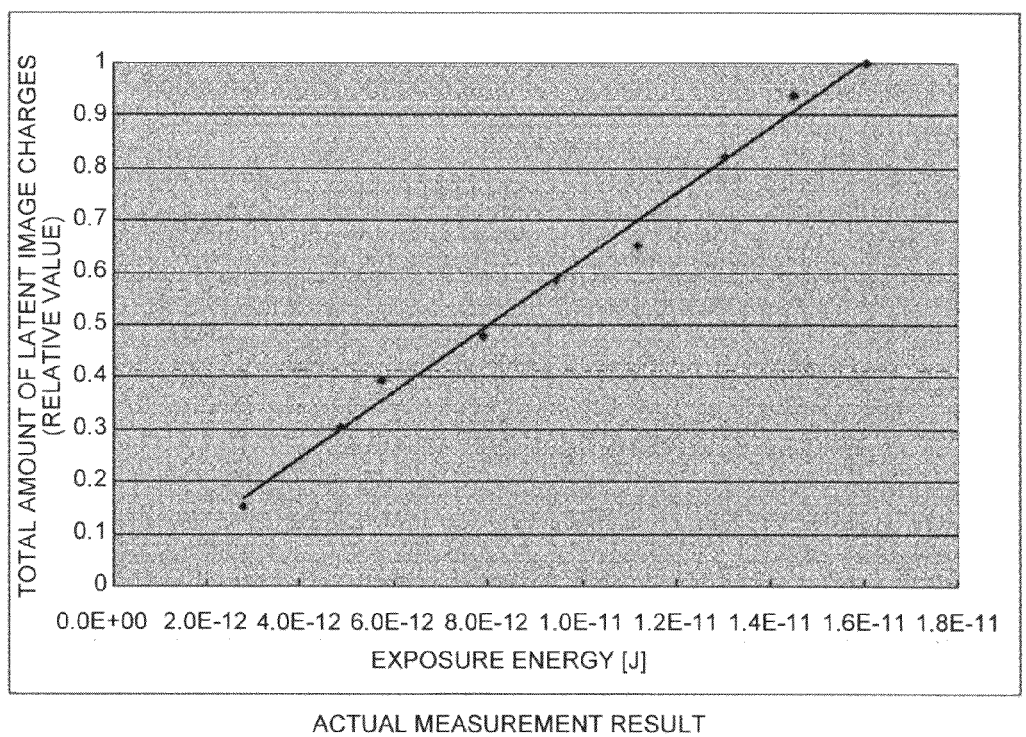
FIG. 19 is a characteristic diagram illustrating a relationship between the total amount of the latent image charge and exposure energy.

FIG. 18 illustrates a process of measuring the total amount of the latent image charge. FIG. 19 illustrates a measurement result of the total amount of the latent image charge using the above-described method. Measurement data exists on a straight line that shows proportion to exposure energy is satisfied and it can be seen that accurate measurement is performed.

Figure 20:
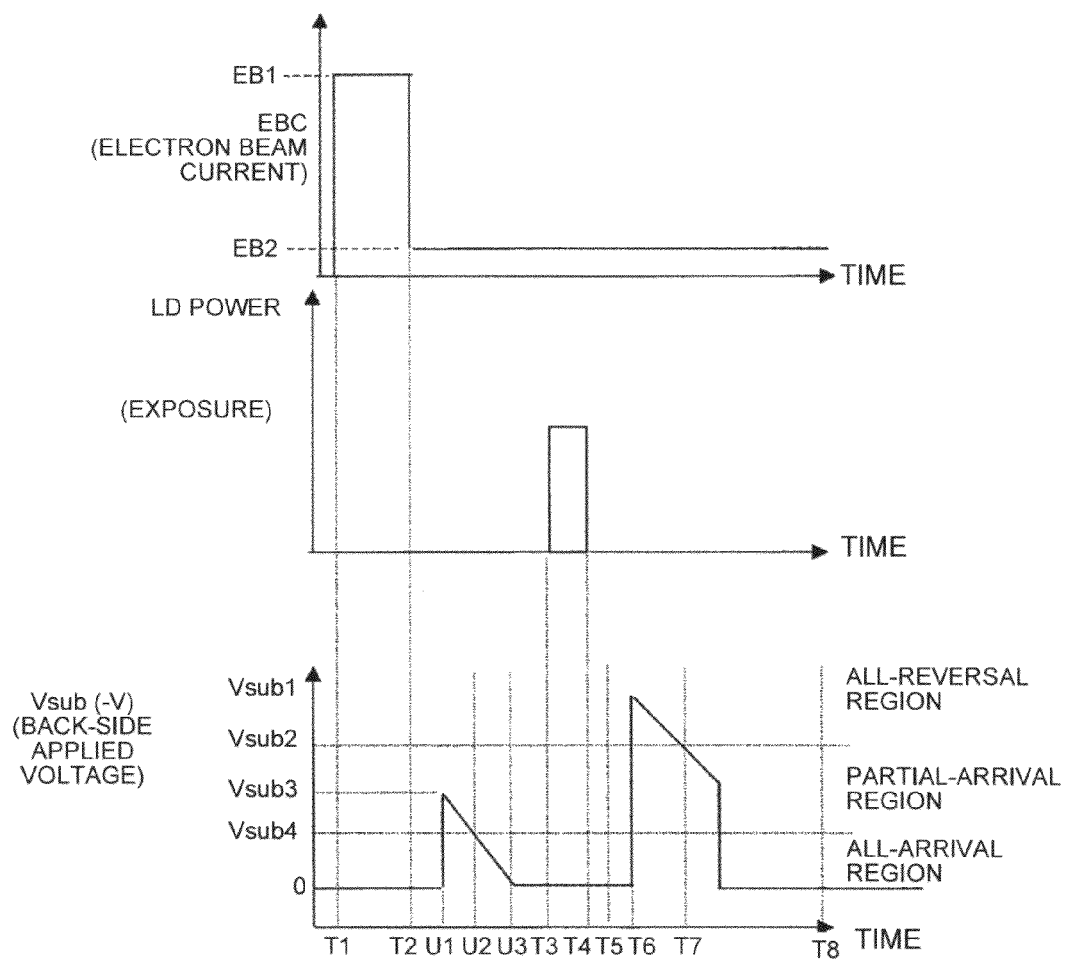
FIG. 20 is a timing chart illustrating a control to obtain the potential saddle point and the latent image area according to another embodiment.

FIG. 20 illustrates another embodiment. Corresponding or identical elements described in the above embodiment will not be appropriately omitted and only the principal part will be described. This embodiment measures data including the charge potential VD with a sequence of operations. In this embodiment, a unit that sets an applied voltage to the back face of the sample in synchronization with an exposure timing and a signal detection timing is provided, and the electric potential of the potential saddle point and the electrostatic latent image area can be obtained in a sequence of operations. A description will be given of a portion in the sequence of FIG. 20, which is different from FIG. 17.

Time U1: The applied voltage Vsub is set to the condition Vsub3 where the incident electrons partially reach the sample.

Time U1 to U3: An image is detected while changing Vsub.

Time U2: An electric potential Vsub4 is obtained as a potential where change from the partial-arrival region to the all-arrival region takes place (this is determined by later image analysis). Calculating a difference between the Vsub4 and the accelerating voltage Vacc (<0) as described below allows obtaining VD.

$VD = Vacc - Vsub4$ $VthD = VD - Vsdl$ $= (Vacc - Vsub4) - (Vacc - Vsub2)$ $= Vsub2 - Vsub4$ This calculation allows obtaining VthD.

In this way, simply varying Vsub in synchronization with an exposure timing and a signal detection timing allows obtaining three of the charge potential, the electric potential of the potential saddle point, and the electrostatic latent image area at a time. Because these can be obtained by a sequence of operations, the error cause is reduced, and thus accurate measurement can be performed accordingly.

Figure 21:
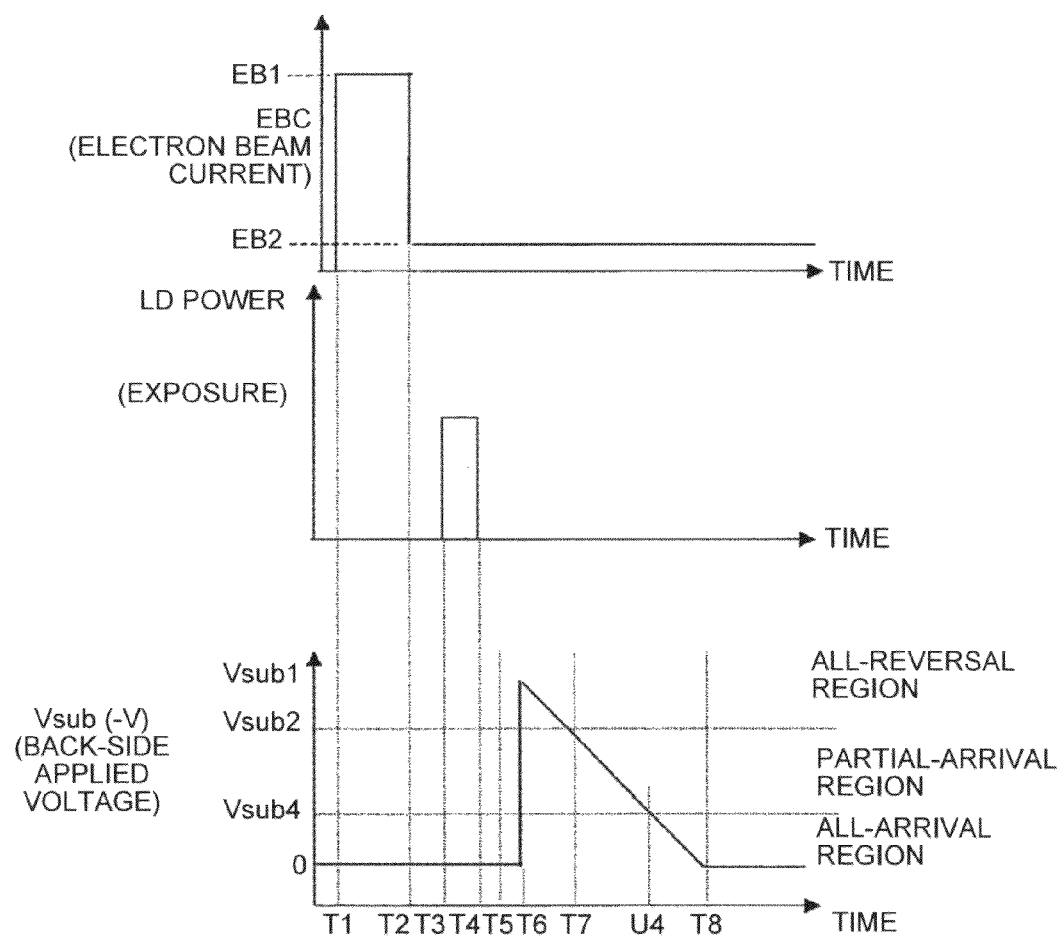
FIG. 21 is a timing chart illustrating a control to obtain the potential saddle point and the latent image area according to another embodiment.

FIG. 21 illustrates another embodiment. This embodiment is characterized in that VD is measured at U4. In this embodiment, the back-side applied voltage is varied across three regions of the all-reversal region, the partial-arrival region, and the all-arrival region after exposure. This allows obtaining data for a short measurement time. This method is similar to the embodiment (Embodiment 2) illustrated in FIG. 20. However, while in Embodiment 2 illustrated in FIG. 20, the value of VD is the electric potential in the non-exposed state, this embodiment differs in that the value of VD is a value after exposure. In the case where VD is measured after the exposure, a position sufficiently apart from the exposed region is preferably taken as an evaluation point.

Figure 22:
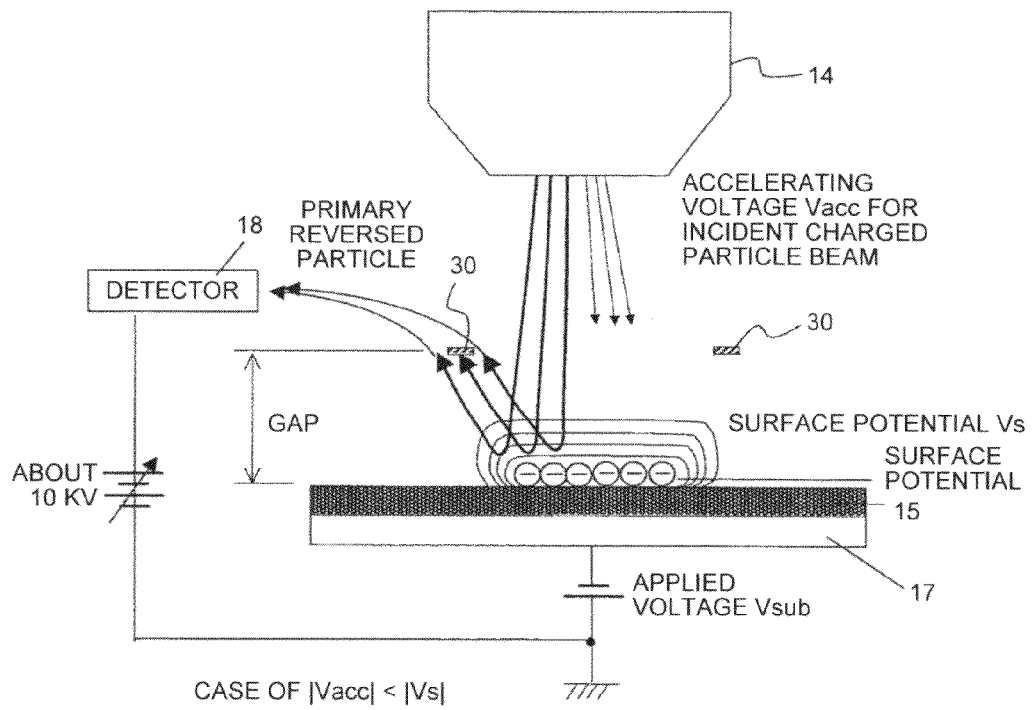
FIG. 22 is a drawing illustrating a configuration to measure the charge potential.
Figure 23:
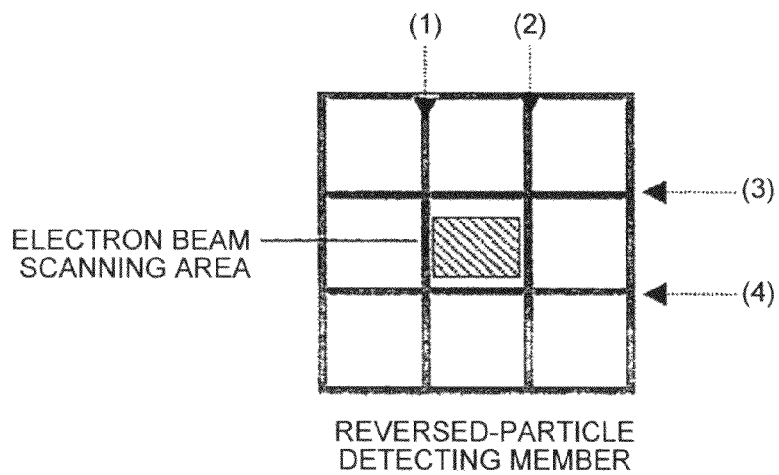
FIG. 23 is a diagram illustrating a relationship between a beam scanning area and a reversed-particle detecting member.
Figure 24:
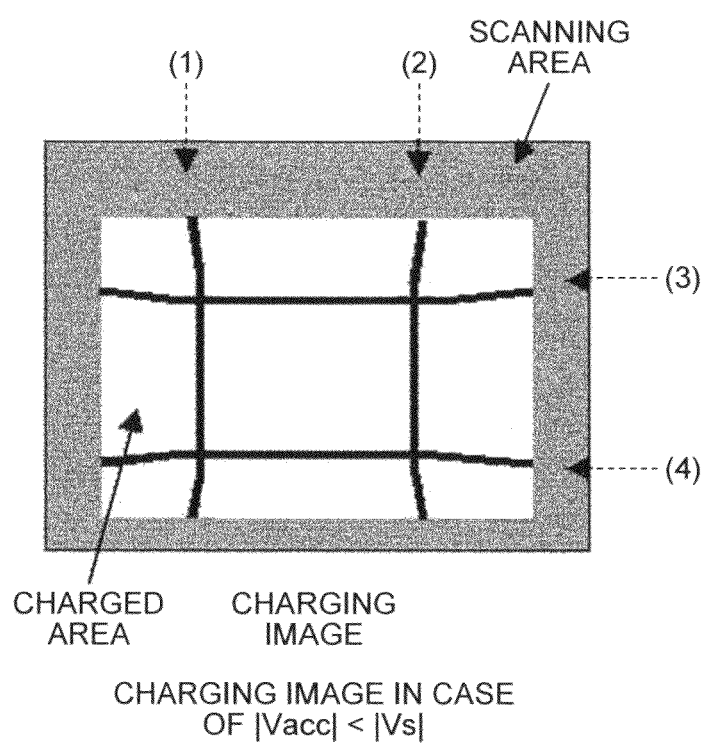
FIG. 24 is a diagram illustrating an observation result of a charging image.

Next, a description will be given of a method of measuring the charge potential, based on FIG. 22 to FIG. 24. Since a region regarding the charge potential is larger than that regarding the latent image charge, a conventional method such as a method using a vibrating capacitance surface potential meter may be employed. A method of measuring the charge potential with high accuracy will be described below. FIG. 22 illustrates a configuration in the case where the surface electric potential |Vs| is higher than the accelerating voltage |Vacc|(|Vacc|<|Vs|). The incident electron is reversed before reaching the sample, and is moved to reach the detector by an electric field generated in the detector due to a pull-in voltage. In this case, unlike the case where the incident electron reaches the sample, there is only one trajectory for the incident electron. Accordingly, all the incident electrons that have collided against the member cannot reach the detector due to hitting against the member. Therefore, the detected amount at the corresponding position is extremely decreased. Therefore, in the observed image (the charging image), the electron is not detected only in a portion where the electron hits a reversed-particle detecting member 30 as a sensor member, making the portion dark. This allows observing the charging image that is dark only in a portion where the incident electron hits a grid mesh as illustrated in FIG. 24. Images (1) to (4) of the dark portions correspond to portions (1) to (4) of a grid illustrated in FIG. 24.

Accordingly, gradually decreasing Vacc allows measuring change from a secondary electron image into a reversed-electron image, thus measuring the surface potential Vs as the boundary condition (|Vacc|=|Vs|) between the secondary electron image and the reversed-electron image. The method of measuring the electric potential while varying the accelerating voltage is especially effective for measuring the surface potential in the case where the sample is made of electrically-conductive material.

Next, a description will be given of a method of measuring a potential saddle point in a space without using the back-side applied voltage Vsub. In this case, the accelerating voltage is simply varied. Assume that the electric potential of the potential saddle point is Vsdl. Under the condition that |Vacc1|<|Vsdl|, the accelerating voltage is too low to allow the incident charged particle to exceed the potential saddle point. Accordingly, the incident charged particle is reversed and reaches the detector, thus providing a bright image. Under the condition that |Vacc3|>|Vsdl|, the accelerating voltage is high so that the incident charged particle can exceed the potential saddle point and reaches the sample. When the incident charged particle reaches the sample, the secondary electron is generated. However, the secondary electron cannot escape from the potential saddle point due to its low energy. As a result, the secondary electron does not reach the detector, thus providing a dark image. A condition satisfying |Vacc2|=|Vsdl| corresponds to a boundary point where the detection signal changes from bright to dark. Accordingly, when Vacc is varied, for example, from Vacc1 to Vacc3, determining Vacc2 that is the boundary of whether the incident charged particle can reach the sample or not allows measuring the electric potential Vsdl of the potential saddle point obtained by measurement.

Figure 25:
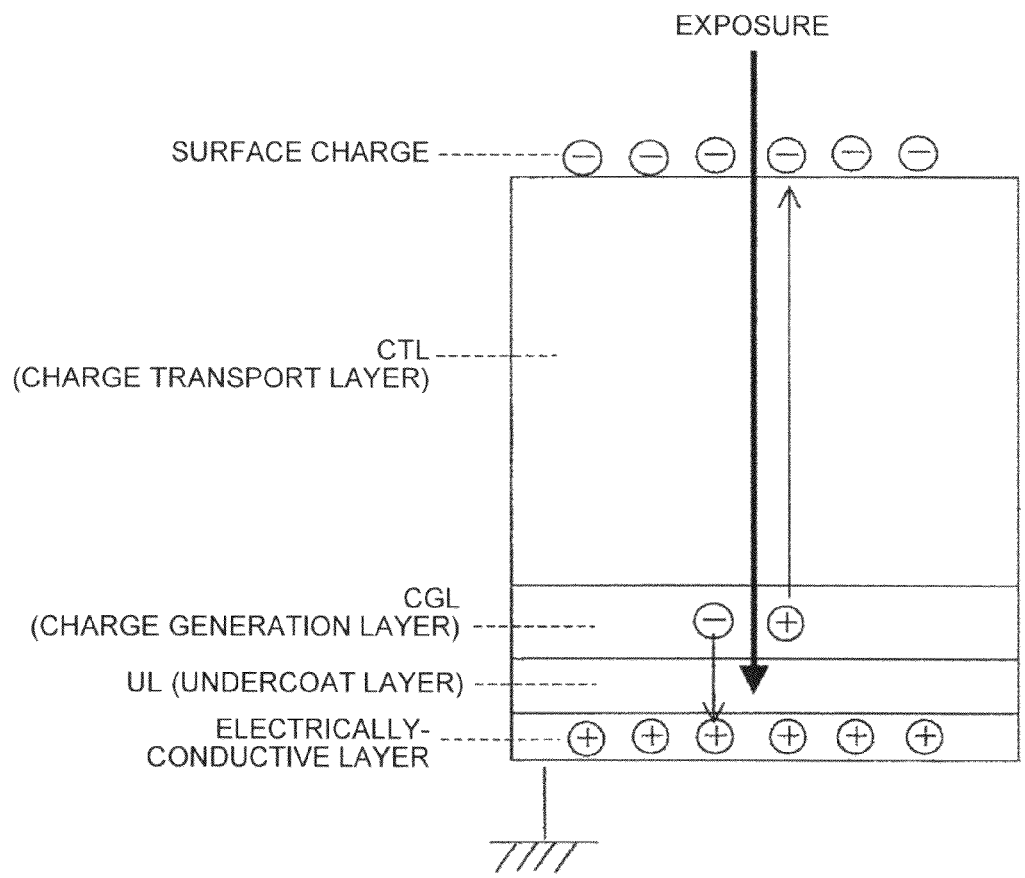
FIG. 25 is cross-sectional view illustrating a function of an organic photoconductor as the sample.

FIG. 25 illustrates an embodiment in which an organic photoconductor (OPC) for electrophotography is employed as a sample. The organic photoconductor (OPC) includes a charge generation layer (CGL) on a conductive supporting member and a charge transport layer (CTL). Exposure in the condition where the surface charge is charged causes a charge generating material (CGM) of the CGL to absorb light and generate both positive and negative charge carriers. One of these carriers is put into the CTL while the other carrier is put into the conductive supporting member by an electric field. The carrier put into the CTL moves through the CTL to a surface of the CTL by an electric field, recombines with the electric charge on the surface of the photosensitive element, and then disappears. This forms a charge distribution, that is, an electrostatic latent image on the surface of the photosensitive element. On the organic photoconductor (OPC), the electric charge decays with time due to dark decay. Thus, it is necessary to complete data acquisition by signal detection within 10 seconds after generation of the latent image at the latest. Giving a function of charging and exposing the sample to be measured inside the apparatus as in the present embodiment allows starting data acquisition immediately after forming the latent image, and thus completing the data acquisition within 10 seconds even in the measurement where the applied voltage required for obtaining a latent image profile is changed multiple times.

Figure 26:
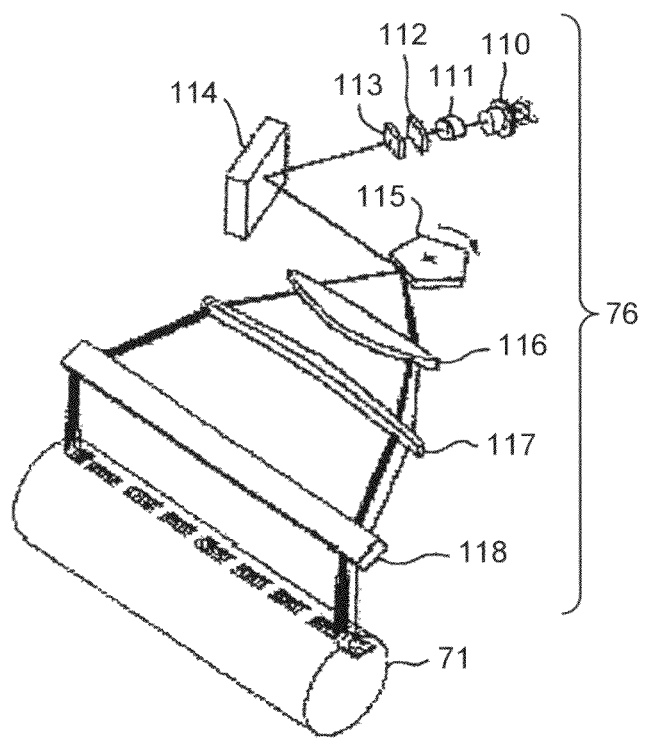
FIG. 26 is a perspective view of an optical scanning device.

FIG. 26 illustrates a concrete example of the optical writing scanning unit (optical scanning device). An exposing unit (optical writing scanning unit) 76 may include a semiconductor laser 110, a collimator lens 111, an aperture 112, a cylinder lens 113, two folding mirrors 114 and 118, a polygon mirror 115, and two scanning lenses 116 and 117. The semiconductor laser 110 emits laser light for exposure. The collimator lens 111 collimates the laser light emitted from the semiconductor laser 110 into an approximately parallel light. The aperture 112 defines a beam diameter of the light that has transmitted through the collimator lens 111. Here, changing the size of the aperture 112 allows generating any beam diameter in a range from 20 μm to 200 μm. The cylinder lens 113 shapes the light that has transmitted through the aperture 112. The folding mirror 114 folds an optical path of the light from the cylinder lens 113 toward the polygon mirror 115. The polygon mirror 115 has a plurality of deflecting surfaces, and deflects the light from the folding mirror 114 to provide a constant angular velocity in a predetermined angular range. The two scanning lenses 116 and 117 convert the light deflected by the polygon mirror 115 into light at a constant velocity. The folding mirror 118 folds an optical path of the light from the scanning lens 117 toward a sample 71.

Figure 27A:
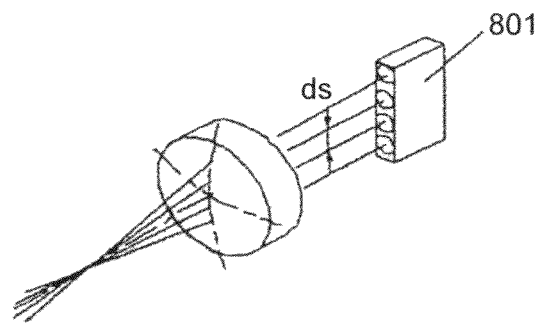
FIGS. 27A and 27B are perspective views illustrating modifications of a light source of an exposing unit.
Figure 27B:
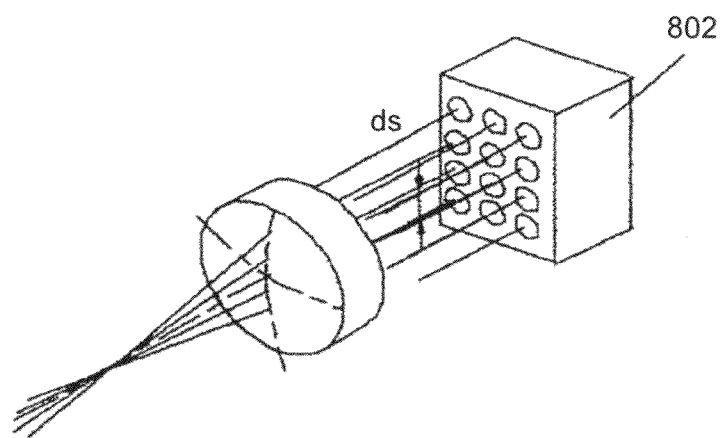

An operation of the exposing unit 76 will be simply described. The light emitted from the semiconductor laser 110 is once focused near the deflecting surface of the polygon mirror 115 via the collimator lens 111, the aperture 112, the cylinder lens 113, and the folding mirror 114. The polygon mirror 115 rotates at a constant velocity in a direction of an arrow in FIG. 26 by a polygon motor (not shown). The light that is focused near the deflecting surface is deflected at a constant angular velocity with this rotation. This deflected light further transmits through the two scanning lenses 116 and 117, and is converted into light that scans in a longitudinal direction of the folding mirror 118 in a predetermined angular range at a constant velocity. Then, this light is reflected by the folding mirror 118, and scans the surface of the sample 71. That is, a light spot moves in a generating line direction of the sample 71. This allows forming any latent image pattern including a line pattern in the generating line direction of the sample 71. The light source may be a multi-beam light source such as VCSEL as illustrated in FIGS. 27A and 27B. In order to form a line pattern, a mechanism that can perform scanning in a main-scanning direction by using a deflecting unit constituted of a reflecting unit such as a galvano scanner and a polygon scanner in the optical system may be employed.

Figure 28:
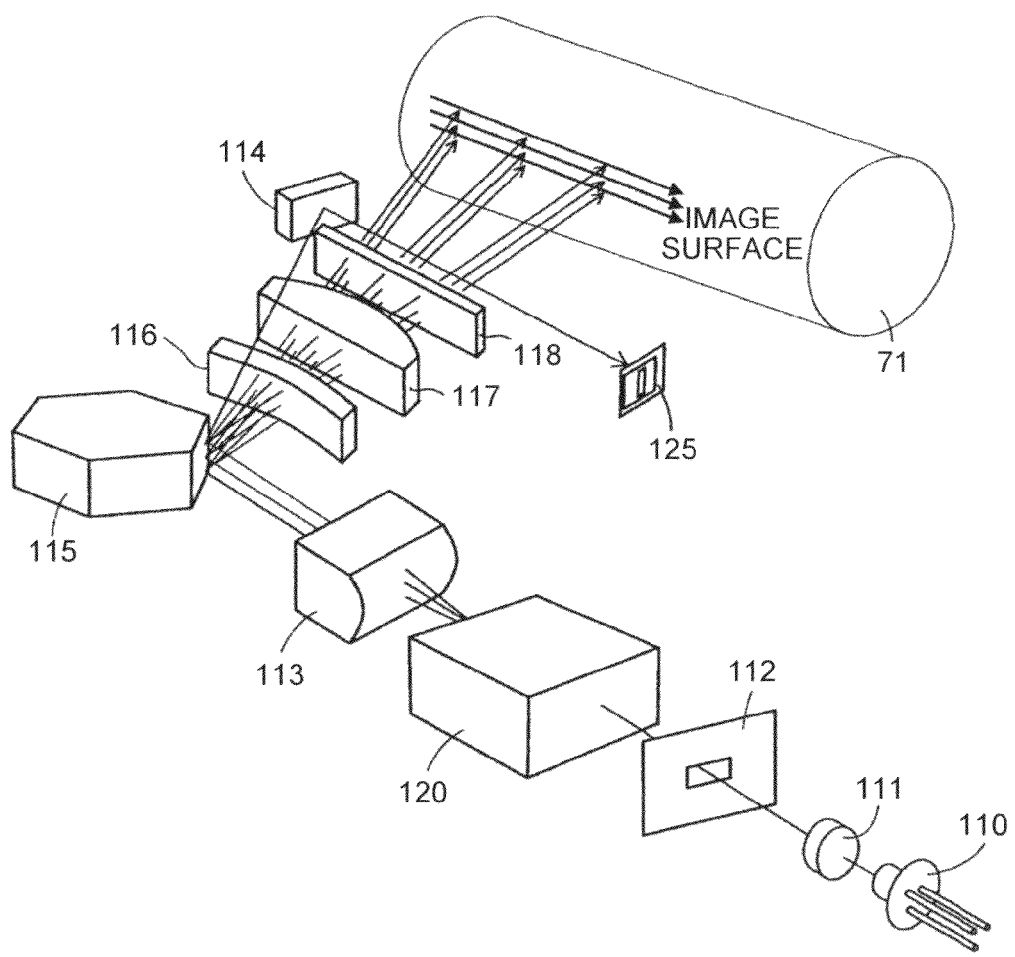
FIG. 28 is a perspective view of a two-dimensional scanning type optical scanning device.

FIG. 28 illustrates another example of the optical writing scanning unit (two-dimensional scanning type). In this example, a diffractive optical deflection element 120 to perform scanning in a sub-scanning direction is disposed. The diffractive optical deflection element 32 may be any optical element as long as it can change coarseness and fineness relating to the refractive index by applying a modulation signal. Examples of this optical element include a liquid crystal modulation element and an electrooptic element. Especially, an acousto-optical deflection device is preferred. The acousto-optical deflection device allows angular modulation of the laser light by frequency modulation. FIG. 28 illustrates a folding mirror 114, and a synchronous detection unit 125.

Figures 29A, 29B:
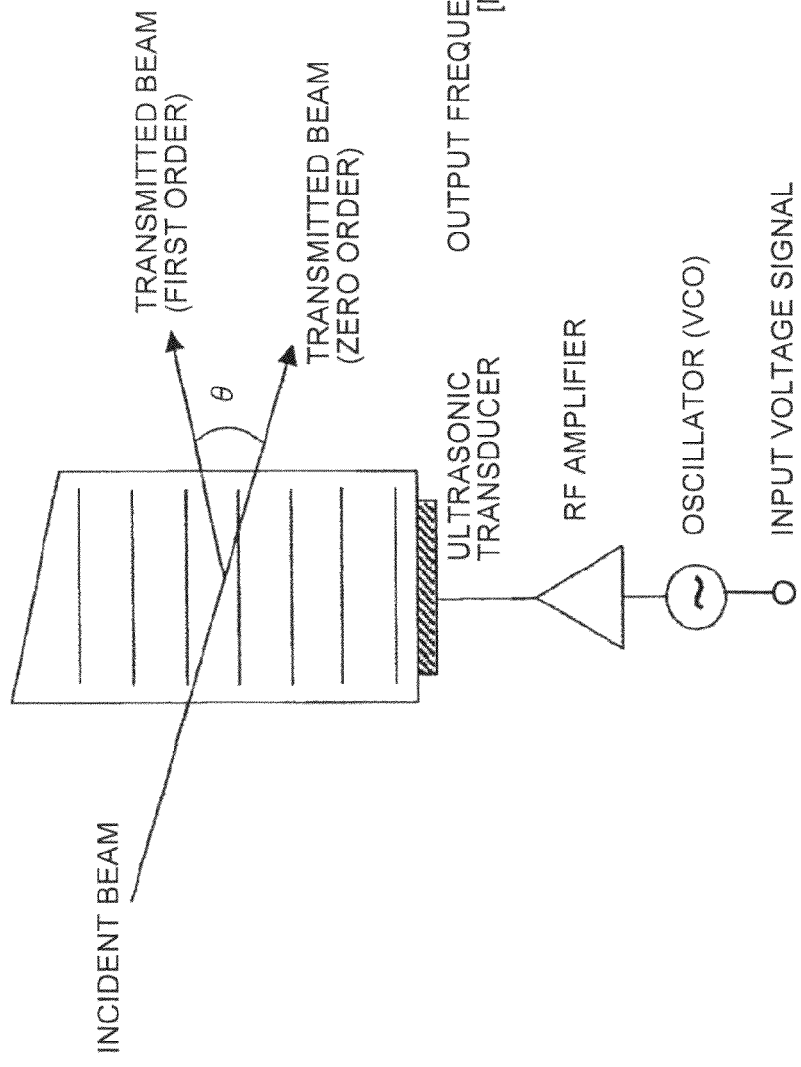
FIGS. 29A and 29B are diagrams illustrating a principle and a function of an acousto-optical deflection device.

FIG. 29A illustrates one embodiment of the acousto-optic device as a light deflector that deflects a light beam perpendicular to a scanning direction of a scanning optical system. The acousto-optical deflection device is an element that generates an ultrasonic sound wave inside of an optical medium, and diffracts laser light by a wave front of the travelling ultrasonic sound wave. The acousto-optical deflection device is a diffractive optical deflection element that can achieve high-speed scanning since this element has no mechanical movable part. An ultrasonic transducer such as a piezoelectric element is bonded to an acousto-optic medium formed of a single crystal or glass such as tellurium dioxide (TeO$_2$) and lead molybdate (PbMoO$_4$). Applying an electric signal to this piezoelectric element from the outside to generate an ultrasonic sound wave and cause this ultrasonic sound wave to travel through the medium allows cousing periodic changes in coarseness and fineness relating to the refractive index in the optical element.

The laser light passing through the medium is diffracted by Bragg diffraction. An incident light causes a zero order diffracted light and additionally causes ±first, second, . . . order diffracted lights. An angle θ between a zero order diffracted light and a first order diffracted light is expressed by the following expression.

$$\theta = \lambda \cdot fa/Va$$

λ: a light wavelength in air, fa: an acoustic-wave fundamental frequency, Va: an acoustic wave velocity In order to change the deflection angle by Δθ, the fundamental frequency fa is preferably shifted by Δfa.

$$\Delta\theta = \lambda \cdot \Delta fa/Va$$

Δfa: acoustic-wave frequency modulation

This element driven by a voltage-controlled oscillator (VCO) and driving by an RF amplifier allows scanning with the light beam in a sub-scanning direction.

Figure 30:
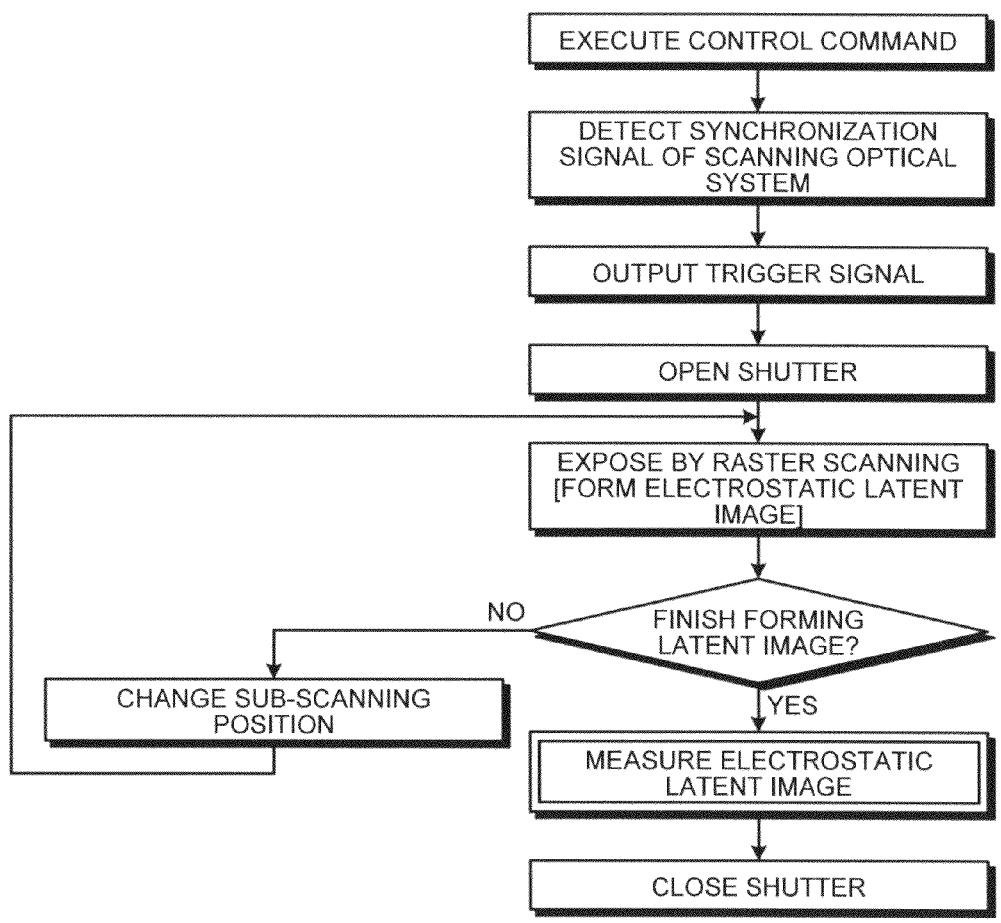
FIG. 30 is a flowchart illustrating a process of a two-dimensional exposure.
Figure 31:
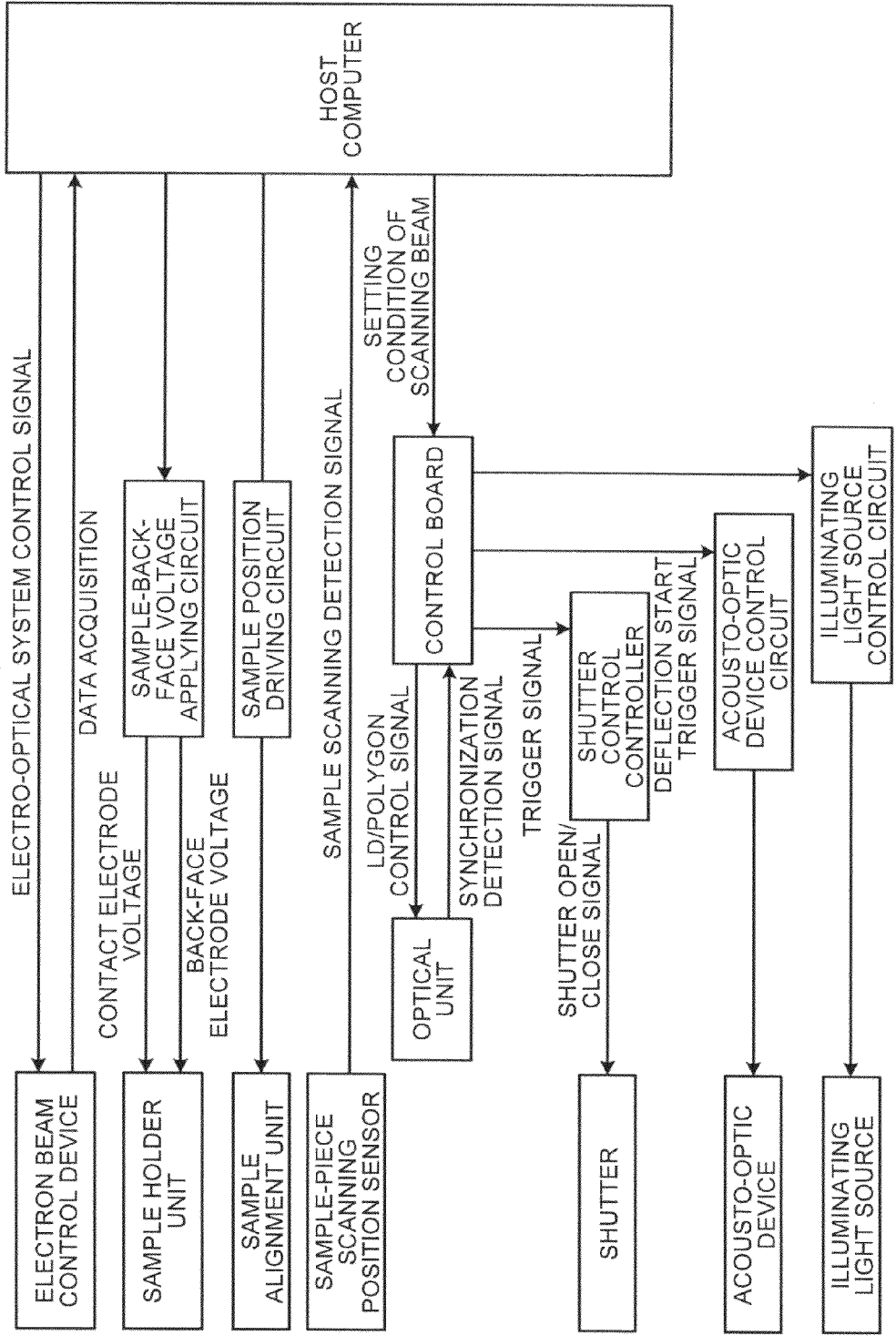
FIG. 31 is a control block diagram of the entire apparatus measuring the total amount of the latent image charge.

FIG. 29B illustrates a relationship between a voltage input to the VCO and an output frequency. Accordingly, inputting an appropriate voltage to the VCO allows deflecting the light in a desired direction. It is preferable to use these to set an exposure condition to macthc an actual apparatus for electrophotography, for example, an exposure energy density of 0.5 to 10 mJ/m$^2$, a beam spot diameter of 30 to 100 μm, a duty, a picture frequency, a writing density, and an image pattern. As the image pattern, various patterns such as a one-dot grate, two-by-two, a two-dot isolated pattern, and a line where a sub-scanning line and an irregular sub-scanning pitch are intentionally formed, in addition to the one-dot isolated pattern, may be formed. FIG. 30 is a flowchart illustrating a process of a two-dimensional exposure. FIG. 31 illustrates a configuration of a system control system. These allow forming an electrostatic latent image on the photoreceptor sample.

While in the above-described embodiment, the case where the electron beam is used as the charged particle beam is described, this is not limited thereto and an ion beam may be used. In this case, an ion gun is used instead of the electron gun 2. In the case where a gallium (Ga) liquid metal ion gun is used as the ion gun, the accelerating voltage is a positive voltage and a bias voltage is applied to the sample 71 such that the surface potential becomes positive. While in the above-described embodiment, the case where the surface potential of the sample is negative is described, the surface potential of the sample may be positive. That is, the surface charge may be positive charge. In this case, a positive ion beam such as a gallium ion beam may be irradiated to the sample. While in the above-described embodiment, the case where a field-emission electron gun is used as the electron gun is described, this is not limited thereto and a thermionic-emission electron gun may be used or a Schottky-emission (SE) electron gun may be used. The SE electron gun is also called a thermal field emission electron gun. While in the above-described embodiment, the case where the primary reversed electron is detected to obtain the surface potential distribution is described, this is not limited thereto and, for example, in the case where there is no risk of influence of material or a surface shape of the sample, the surface electric potential may be obtained by detecting the secondary electron.

Use of the above-described technique that measures the total amount of the latent image charge at the level of one dot size with high accuracy realizes an apparatus that forms an image with high image quality. In an image forming apparatus, an environment such as temperature and humidity and a continuous operating state cause fatigue of the photosensitive element and change in electrical characteristic of a developer or the like, and thus toner attachment amount on a paper varies even if amount of exposure is constant. By preliminarily obtaining a relationship between the characteristic of the photosensitive element and the total amount of the latent image charge, and properly setting a tuning parameter for a γ correction or the like according to an operating condition of a machine in the actual apparatus, a satisfactory output image can be obtained any time.

Figure 32A:
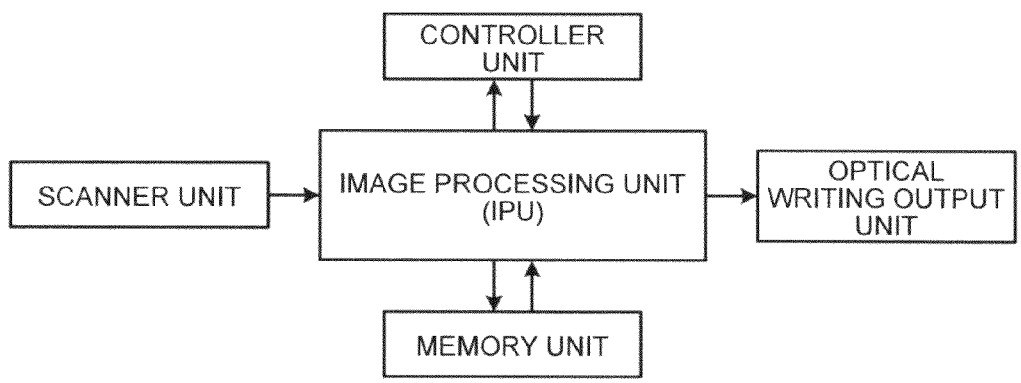
FIGS. 32A and 32B are block diagrams illustrating a configuration and a function of the image processing unit in the image forming apparatus.
Figure 32B:
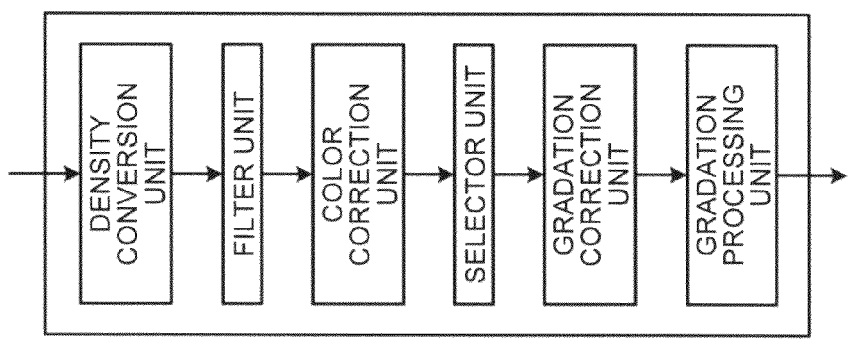

FIGS. 32A and 32B illustrate a data processing unit of the image forming apparatus. The data processing unit includes, as illustrated in FIG. 32A, an image processing unit, a controller unit, a memory unit, and an optical writing output unit. The controller unit performs processes such as rotation, repeat, aggregation, and compression and extension, and then performs output to an IPU again. The optical writing output unit performs light modulation for an LD or an LED corresponding to lighting data by a control driver, so as to form an electrostatic latent image on the photosensitive element. The image processing unit (IPU) includes, as illustrated in FIG. 32B, a density conversion unit, a filter unit, a color correction unit, a selector, a gradation correction unit, and a gradation processing unit. The density conversion unit converts RGB image data from a scanner into density data using a reference table, and outputs the density data to the filter unit. The filter unit performs an image correction process such as a smoothing process and an edge emphasis process on the density data input from the density conversion unit, and then outputs the processed data to the color correction unit. The color correction unit performs a color correction (masking) process. The selector selects any of C, M, Y, and K for the image data input from the color correction unit under control of an IPU controller, and then outputs the selection result to the gradation correction unit.

The gradation correction unit is preliminarily stored for each data of C, M, Y, and K input from the selector. The gradation processing unit performs a gradation process such as a dither process on the image data input from the gradation correction unit, and then outputs a signal to the optical writing output unit. The writing light output unit forms an image on a recording sheet based on this input signal from the gradation processing unit. In the gradation correction unit, a γ curve that allows obtaining a linear characteristic for the input data is set. The reference table is prepared in an image memory unit as a storing unit to store various kinds of data.

Figure 33:
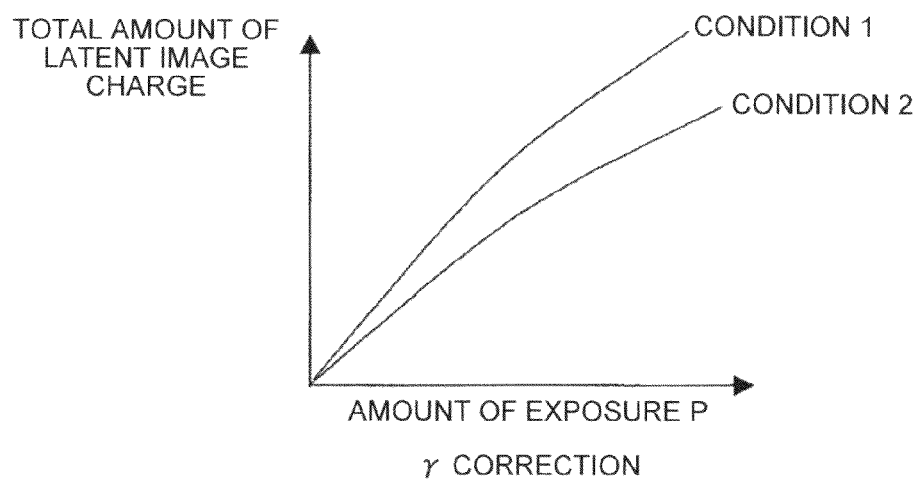
FIG. 33 is a characteristic diagram illustrating a relationship between the total amount of the latent image charge and an amount of exposure in γ correction.
Figure 34:
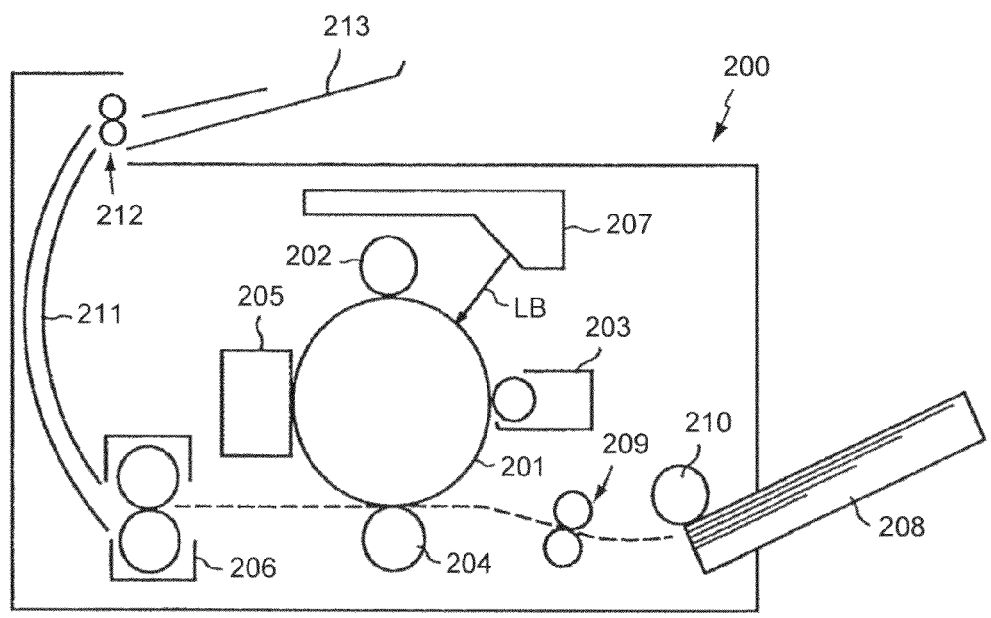
FIG. 34 is a schematic diagram of the image forming apparatus.

As illustrated in FIG. 33, by performing a γ correction that changes according to an environment and an output state, setting is performed so that the amount of the latent image charge becomes a target value. By preliminarily storing the data obtained by actual measurement, in the memory (a memory unit), which is not shown, or the like in a state of a reference table or the like and performing a proper γ correction by the gradation correction unit or the like, a satisfactory output image can be always obtained. FIG. 34 illustrates an exemplary image forming apparatus (a laser printer) to which the present invention is applied. A laser printer 200 includes a "photoconductive photosensitive element formed in a cylindrical shape" as an image carrier 201. Around the image carrier 201, a charging roller 202 as a charging unit, a developing device 203, a transfer roller 204, and a cleaning device 205 are disposed. While in this embodiment, the charging roller 112 of a contact-type that generates less ozone is used as the "charging unit", a corona charger that utilizes corona discharge may be used as the charging unit. An optical scanning device 207 is disposed to perform "exposure by light scanning with a laser beam LB" between the roller charging device 202 and the developing device 203.

FIG. 34 illustrates a fixing device 206, a paper cassette 208, a pair of registration rollers 209, a paper feeding roller 210, a conveying path 211, a pair of ejecting rollers 212, and a discharge tray 213. When performing image forming, the image carrier 201 as the photoconductive photosensitive element rotates clockwise at a constant velocity. A surface of the photosensitive element is uniformly charged by the charging roller 202. Subsequently, exposure by optical writing with a laser beam from the optical scanning device 207 forms an electrostatic latent image. The formed electrostatic latent image is what is called a "negative latent image" where an image portion is exposed. This electrostatic latent image is reversely developed by the developing device 203. Accordingly, a toner image is formed on the image carrier 201.

The paper cassette 208 that stores transfer paper sheets is detachably attached to a main body of the image forming apparatus 200, and a topmost transfer paper sheet of the stored transfer paper sheets is fed by the paper feeding roller 210 in the state where the paper cassette 208 is attached as illustrated in the drawing. A leading end of the fed transfer paper sheet is sandwiched between the pair of registration rollers 209. The pair of registration rollers 209 supplies the transfer paper sheet to a transfer unit in synchronization with the movement of the toner image on the image carrier 201 to a transfer position. On the supplied transfer paper, the toner image is overlapped in the transfer unit, and the toner image is electrostatically transferred by action of the transfer roller 204. On the transfer paper sheet where the toner image is transferred, the fixing device 206 fixes the toner image. Subsequently, the transfer paper sheet passes through the conveying path 211, and is discharged onto the discharge tray 213 by the pair of discharging rollers 212. After the toner image is transferred, a surface of the image carrier 201 is cleaned by the cleaning device 205, thus removing residual toner, paper dust, and so on.

As described above, a known method only measures the amount of the electric charge in a wide charge distribution region that satisfies a relation in the parallel plate capacitor model. In contrast, by obtaining information on the electrostatic latent image area and the electric potential at the potential saddle point formed by the charge distribution of the sample and performing the calculation process, the total amount of the latent image charge can be obtained even in the size of several tens of microns in size, which is comparable to the dot size. By detecting the primary electron signal for the electric potential at the potential saddle point and detecting the secondary electron signal for the electrostatic latent image area, the total amount of the latent image charge can be measured. Despite use of different detection methods, this configuration allows detecting both of the signals with one formation of the latent image, thus enabling measurement with high accuracy.

By setting the voltage applied to the back face of the sample in synchronization with the time at exposure timing and the time at signal detection timing, the electric potential at the potential saddle point and the electrostatic latent image area can be obtained in a sequence of operations despite use of different detection methods. If the sample is a photosensitive drum that is used in an electrophotographic image forming apparatus such as a laser printer and a digital copier, feeding back the measurement result by the method of measuring the total amount of the latent image charge according to the present invention to the design of the image forming apparatus improves process quality of each process related to the image formation. This achieves high image quality, high durability, high stability, and energy saving. Evaluation using the measurement method and the measuring apparatus according to the present invention allows preliminarily understanding a dependence of the total amount of the latent image charge on the photosensitive element to perform the correction. By storing this result in the image memory of the data processing unit and using this for the correction of the image processing, a satisfactory output image can be obtained. As a result, this allows providing an image forming apparatus that is excellent in high image quality, high durability, high stability, and energy saving. The present invention is suitable especially for an image forming apparatus that includes a multi-beam scan optical system such as VCSEL.

One aspect of the present invention allows measuring the total amount of the latent image charge with high accuracy. Accordingly, reflecting a measurement result on the scanning control for optical writing allows controlling the toner attachment amount with high accuracy, thus contributing to high image quality.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A method of measuring a total amount of latent image charge, the method comprising:
scanning a sample with a charged particle beam, the sample having a charge distribution on a surface of the sample, the charge distribution being caused by forming an electrostatic latent image by exposure;

measuring a state of a surface charge distribution on the sample based on a detection signal obtained by the scanning;

obtaining an electric potential at a potential saddle point, the potential saddle point being formed by the surface charge distribution of the sample;

obtaining an electrostatic latent image area, the electrostatic latent image being formed by the surface charge distribution of the sample; and performing a calculation using the electric potential at the potential saddle point and the electrostatic latent image area to measure a total amount of electric charge of the electrostatic latent image, wherein the electric potential at the potential saddle point is obtained based on detection of a primary electron signal, the primary electron signal being caused by a charged particle beam reversed before reaching the sample, the electrostatic latent image area is obtained based on detection of a secondary electron signal, the secondary electron signal being caused by a secondary electron generated when a charged particle beam reaches the sample, and the primary electron signal and the secondary electron signal are detected with one formation of a latent image.

2. The method of measuring a total amount of latent image charge, the method comprising:

scanning a sample with a charged particle beam, the sample having a charge distribution on a surface of the sample, the charge distribution being caused by forming an electrostatic latent image by exposure;

measuring a state of a surface charge distribution on the sample based on a detection signal obtained by the scanning;

obtaining an electric potential at a potential saddle point, the potential saddle point being formed by the surface charge distribution of the sample;

obtaining an electrostatic latent image area, the electrostatic latent image being formed by the surface charge distribution of the sample; and performing a calculation using the electric potential at the potential saddle point and the electrostatic latent image area to measure a total amount of electric charge of the electrostatic latent image, wherein the electric potential at the potential saddle point is obtained based on detection of a primary electron signal, the primary electron signal being caused by a charged particle beam reversed before reaching the sample, the electrostatic latent image area is obtained based on detection of a secondary electron signal, the secondary electron signal being caused by a secondary electron generated when a charged particle beam reaches the sample, a voltage is applied to a back face of the sample, and an electric potential of this voltage is set based on an exposure timing, a detection timing of the primary electron signal, and a detection timing of the secondary electron signal.

3. The method of measuring the total amount of the latent image charge according to claim 1, wherein a voltage is applied to a back face of the sample, and an electric potential of this voltage is set based on an exposure timing, a detection timing of the primary electron signal, and a detection timing of the secondary electron signal.

4. An image forming method, comprising:

obtaining a relationship between a condition of a photosensitive element and a total amount of latent image charge based on a result of the total amount of the latent image charge, the result being obtained by performing a method of measuring the total amount of the latent image charge that includes:

scanning a sample with a charged particle beam, the sample having a charge distribution on a surface of the sample, the charge distribution being caused by forming an electrostatic latent image by exposure, measuring a state of a surface charge distribution on the sample based on a detection signal obtained by the scanning, obtaining an electric potential at a potential saddle point, the potential saddle point being formed by the surface charge distribution of the sample, obtaining an electrostatic latent image area, the electrostatic latent image being formed by the surface charge distribution of the sample, and performing a calculation using the electric potential at the potential saddle point and the electrostatic latent image area to measure a total amount of electric charge of the electrostatic latent image; and performing image processing while correcting a light output such that a latent image having a desired total amount of latent image charge is formed.

5. An image forming apparatus, comprising:

a memory unit that stores a relationship between a condition of a photosensitive element and a total amount of latent image charge as data, the relationship being obtained based on a result of the total amount of the latent image charge, the result being obtained by performing a method of measuring the total amount of the latent image charge that includes:

scanning a sample with a charged particle beam, the sample having a charge distribution on a surface of the sample, the charge distribution being caused by forming an electrostatic latent image by exposure, measuring a state of a surface charge distribution on the sample based on a detection signal obtained by the scanning, obtaining an electric potential at a potential saddle point, the potential saddle point being formed by the surface charge distribution of the sample, obtaining an electrostatic latent image area, the electrostatic latent image being formed by the surface charge distribution of the sample, and performing a calculation using the electric potential at the potential saddle point and the electrostatic latent image area to measure a total amount of electric charge of the electrostatic latent image; and an image processing unit that corrects a light output to form an electrostatic latent image using the data stored in the memory unit.

6. An apparatus measuring a total amount of latent image charge, comprising:

a charging unit that charges a sample;

an exposing unit that forms an electrostatic latent image on the charged sample;

a charged particle beam scanning unit that two-dimensionally scans a sample surface with a charged particle beam, the sample surface having a charge distribution caused by formation of the electrostatic latent image;

a unit that obtains an electric potential at a potential saddle point formed by a surface charge distribution of the sample;

a unit that obtains an area of an electrostatic latent image formed by a surface charge distribution of the sample; and a unit that calculates a total amount of latent image charge based on the obtained electric potential at the potential saddle point and the obtained electrostatic latent image area wherein the unit that obtains the electric potential at the potential saddle point obtains the electric potential at the potential saddle point based on detection of a primary electron signal, the primary electron signal being caused by a charged particle beam reversed before reaching the sample, the unit that obtains the electrostatic latent image area obtains the electrostatic latent image area based on detection of a secondary electron signal, the secondary electron signal being caused by a secondary electron generated when the charged particle beam reaches the sample, and the apparatus detects the primary electron signal and the secondary electron signal with one formation of a latent image.

7. An apparatus measuring a total amount of the latent image charge, comprising:

a charging unit that charges a sample;

an exposing unit that forms an electrostatic latent image on the charged sample;

a charged particle beam scanning unit that two-dimensionally scans a sample surface with a charged particle beam, the sample surface having a charge distribution caused by formation of the electrostatic latent image;

a unit that obtains an electric potential at a potential saddle point formed by a surface charge distribution of the sample;

a unit that obtains an area of an electrostatic latent image formed by a surface charge distribution of the sample;

a unit that calculates a total amount of latent image charge based on the obtained electric potential at the potential saddle point and the obtained electrostatic latent image area; and a unit that applies a voltage to a back face of the sample, wherein an electric potential of the voltage is set based on an exposure timing, a detection timing of the primary electron signal, and a detection timing of the secondary electron signal.

8. An apparatus measuring a total amount of latent image charge, comprising:

a charging unit that charges a sample;

an exposing unit that forms an electrostatic latent image on the charged sample;

a charged particle beam scanning unit that two-dimensionally scans a sample surface with a charged particle beam, the sample surface having a charge distribution caused by formation of the electrostatic latent image;

a unit that obtains an electric potential at a potential saddle point formed by a surface charge distribution of the sample;

a unit that obtains an area of an electrostatic latent image formed by a surface charge distribution of the sample;

a unit that calculates a total amount of latent image charge based on the obtained electric potential at the potential saddle point and the obtained electrostatic latent image area; and a unit that applies a voltage to a back face of the sample, wherein the unit that obtains the electric potential at the potential saddle point obtains the electric potential at the potential saddle point based on detection of a primary electron signal, the primary electron signal being caused by a charged particle beam reversed before reaching the sample, the unit that obtains the electrostatic latent image area obtains the electrostatic latent image area based on detection of a secondary electron signal, the secondary electron signal being caused by a secondary electron generated when the charged particle beam reaches the sample, and an electric potential of the voltage is set based on an exposure timing, a detection timing of the primary electron signal, and a detection timing of the secondary electron signal.

9. An image forming method, comprising:

obtaining a relationship between a condition of a photosensitive element and a total amount of latent image charge based on a result of the total amount of the latent image charge, the result being obtained by using an apparatus measuring the total amount of the latent image charge includes:

a charging unit that charges a sample, an exposing unit that forms an electrostatic latent image on the charged sample, a charged particle beam scanning unit that two-dimensionally scans a sample surface with a charged particle beam, the sample surface having a charge distribution caused by formation of the electrostatic latent image, a unit that obtains an electric potential at a potential saddle point formed by a surface charge distribution of the sample, a unit that obtains an area of an electrostatic latent image formed by a surface charge distribution of the sample, and a unit that calculates a total amount of latent image charge based on the obtained electric potential at the potential saddle point and the obtained electrostatic latent image area; and performing image processing while correcting a light output such that a latent image having a desired total amount of latent image charge is formed.

* * * * *